United States Patent
Dordi et al.

(10) Patent No.: US 7,497,932 B2
(45) Date of Patent: *Mar. 3, 2009

(54) ELECTRO-CHEMICAL DEPOSITION SYSTEM

(75) Inventors: Yezdi Dordi, Palo Alto, CA (US); Donald J. Olgado, Palo Alto, CA (US); Ratson Morad, Palo Alto, CA (US); Peter Hey, Sunnyvale, CA (US); Mark Denome, San Jose, CA (US); Michael Sugarman, San Francisco, CA (US); Mark Lloyd, Fremont, CA (US); Anna Marie Lloyd, legal representative, Fremont, CA (US); Joseph Stevens, San Jose, CA (US); Dan Marohl, San Jose, CA (US); Ho Seon Shin, Mountain View, CA (US); Eugene Ravinovich, Fremont, CA (US); Robin Cheung, Cupertino, CA (US); Ashok K. Sinha, Palo Alto, CA (US); Avi Tepman, Cupertino, CA (US); Dan Carl, Pleasanton, CA (US); George Birkmaier, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/476,945

(22) Filed: Jun. 27, 2006

(65) Prior Publication Data

US 2006/0246690 A1 Nov. 2, 2006

Related U.S. Application Data

(63) Continuation of application No. 10/690,033, filed on Oct. 20, 2003, now abandoned, which is a continuation of application No. 09/867,780, filed on May 29, 2001, now Pat. No. 6,635,157, which is a continuation of application No. 09/289,074, filed on Apr. 8, 1999, now Pat. No. 6,258,220.

(60) Provisional application No. 60/110,209, filed on Nov. 30, 1998.

(51) Int. Cl.
C25D 5/00 (2006.01)
C25D 17/06 (2006.01)
C25D 7/12 (2006.01)
C23C 14/00 (2006.01)
C23C 18/16 (2006.01)

(52) U.S. Cl. .................. 204/242; 204/298.02; 205/157; 118/428; 118/503; 427/99.5

(58) Field of Classification Search ....................... None
See application file for complete search history.

(56) References Cited

U.S. PATENT DOCUMENTS 4,120,711 A 10/1978 Gudeman
(Continued)

FOREIGN PATENT DOCUMENTS

JP 407014811 1/1995
(Continued)

OTHER PUBLICATIONS

PCT Written Opinion for International Application No. PCT/US01/20624 dated Aug. 8, 2006. (APPM/002601PC05).
(Continued)

*Primary Examiner*—Harry D Wilkins, III
(74) *Attorney, Agent, or Firm*—Patterson & Sheridan

(57) ABSTRACT

The present invention provides an electro-chemical deposition system that is designed with a flexible architecture that is expandable to accommodate future designs and gap fill requirements and provides satisfactory throughput to meet the demands of other processing systems. The electro-chemical deposition system generally comprises a mainframe having a mainframe wafer transfer robot, a loading station disposed in connection with the mainframe, one or more processing cells disposed in connection with the mainframe, and an electrolyte supply fluidly connected to the one or more electrical processing cells. Preferably, the electro-chemical deposition system includes a spin-rinse-dry (SRD) station disposed between the loading station and the mainframe, a rapid thermal anneal chamber attached to the loading station, and a system controller for controlling the electro-chemical deposition process and the components of the electro-chemical deposition system.

4 Claims, 23 Drawing Sheets

U.S. PATENT DOCUMENTS

| | | | |
|---|---|---|---|
| 5,512,163 A | | 4/1996 | Warfield |
| 5,605,615 A | | 2/1997 | Goolsby et al. |
| 5,807,469 A | * | 9/1998 | Crafts et al. ........... 204/297.06 |
| 6,027,631 A | | 2/2000 | Broadbent |
| 6,042,712 A | * | 3/2000 | Mathieu ..................... 205/209 |

FOREIGN PATENT DOCUMENTS

| | | |
|---|---|---|
| WO | WO 99/25905 | 5/1999 |
| WO | WO 00/32835 | 6/2000 |

OTHER PUBLICATIONS

PCT Notification of Transmittal of International Preliminary Examination Report dated Apr. 13, 2007 for PCT/US01/31943.

PCT Written Opinion dated Sep. 21, 2007 for PCT International Application No. PCT/US2001/30058.

* cited by examiner

ELECTRO-CHEMICAL DEPOSITION SYSTEM

CROSS-REFERENCE TO RELATED APPLICATIONS

This application is a continuation of U.S. patent application Ser. No. 10/690,033, filed on Oct. 20, 2003, now abandoned which is a continuation of U.S. patent application Ser. No. 09/867,780, filed May. 29, 2001, now U.S. Pat. No. 6,635,157, which is a continuation of U.S. patent application Ser. No. 09/289,074, filed Apr. 8, 1999, now U.S. Pat. No. 6,258,220, which claims benefit of U.S. Provisional Patent Application Ser. No. 60/110,209, filed Nov. 30, 1998. Each of the aforementioned related patent applications is herein incorporated by reference.

BACKGROUND OF THE INVENTION

1. Field of the Invention

The present invention generally relates to deposition of a metal layer onto a wafer/substrate. More particularly, the present invention relates to an electro-chemical deposition or electroplating system for forming a metal layer on a wafer/substrate.

2. Description of the Related Art

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

As circuit densities increase, the widths of vias, contacts and other features, as well as the dielectric materials between them, decrease to less than 250 nanometers, whereas the thickness of the dielectric layers remains substantially constant, with the result that the aspect ratios for the features, i.e., their height divided by width, increases. Many traditional deposition processes, such as physical vapor deposition (PVD) and chemical vapor deposition (CVD), have difficulty filling structures where the aspect ratio exceed 4:1, and particularly where it exceeds 10:1. Therefore, there is a great amount of ongoing effort being directed at the formation of void-free, nanometer-sized features having high aspect ratios wherein the ratio of feature height to feature width can be 4:1 or higher. Additionally, as the feature widths decrease, the device current remains constant or increases, which results in an increased current density in the feature.

Elemental aluminum (Al) and its alloys have been the traditional metals used to form lines and plugs in semiconductor processing because of aluminum's perceived low electrical resistivity, its superior adhesion to silicon dioxide ($SiO_2$), its ease of patterning, and the ability to obtain it in a highly pure form. However, aluminum has a higher electrical resistivity than other more conductive metals such as copper, and aluminum also can suffer from electromigration leading to the formation of voids in the conductor.

Copper and its alloys have lower resistivities than aluminum and significantly higher electromigration resistance as compared to aluminum. These characteristics are important for supporting the higher current densities experienced at high levels of integration and increase device speed. Copper also has good thermal conductivity and is available in a highly pure state. Therefore, copper is becoming a choice metal for filling sub-quarter micron, high aspect ratio interconnect features on semiconductor substrates.

Despite the desirability of using copper for semiconductor device fabrication, choices of fabrication methods for depositing copper into very high aspect ratio features, such as a 4:1, having 0.35μ (or less) wide vias are limited. As a result of these process limitations, plating, which had previously been limited to the fabrication of lines on circuit boards, is just now being used to fill vias and contacts on semiconductor devices.

Metal electroplating is generally known and can be achieved by a variety of techniques. A typical method generally comprises physical vapor depositing a barrier layer over the feature surfaces, physical vapor depositing a conductive metal seed layer, preferably copper, over the barrier layer, and then electroplating a conductive metal over the seed layer to fill the structure/feature. Finally, the deposited layers and the dielectric layers are planarized, such as by chemical mechanical polishing (CMP), to define a conductive interconnect feature.

FIG. 1 is a cross sectional view of a simplified typical fountain plater 10 incorporating contact pins. Generally, the fountain plater 10 includes an electrolyte container 12 having a top opening, a substrate holder 14 disposed above the electrolyte container 12, an anode 16 disposed at a bottom portion of the electrolyte container 12 and a contact ring 20 contacting the substrate 22. A plurality of grooves 24 are formed in the lower surface of the substrate holder 14. A vacuum pump (not shown) is coupled to the substrate holder 14 and communicates with the grooves 24 to create a vacuum condition capable of securing the substrate 22 to the substrate holder 14 during processing. The contact ring 20 comprises a plurality of metallic or semi-metallic contact pins 26 distributed about the peripheral portion of the substrate 22 to define a central substrate plating surface. The plurality of contact pins 26 extend radially inwardly over a narrow perimeter portion of the substrate 22 and contact a conductive seed layer of the substrate 22 at the tips of the contact pins 26. A power supply (not shown) is attached to the pins 26 thereby providing an electrical bias to the substrate 22. The substrate 22 is positioned above the cylindrical electrolyte container 12 and electrolyte flow impinges perpendicularly on the substrate plating surface during operation of the cell 10.

While present day electroplating cells, such as the one shown in FIG. 1, achieve acceptable results on larger scale substrates, a number of obstacles impair consistent reliable electroplating onto substrates having micron-sized, high aspect ratio features. Generally, these obstacles include providing uniform power distribution and current density across the substrate plating surface to form a metal layer having uniform thickness, preventing unwanted edge and backside deposition to control contamination to the substrate being processed as well as subsequent substrates, and maintaining a vacuum condition which secures the substrate to the substrate holder during processing. Also, the present day electroplating cells have not provided satisfactory throughput to meet the demands of other processing systems and are not designed with a flexible architecture that is expandable to accommodate future designs rules and gap fill requirements. Furthermore, current electroplating system platforms have not provided post electrochemical deposition treatment, such as a rapid thermal anneal treatment, for enhancing deposition results within the same system platform.

Additionally, current electroplating systems are incapable of performing necessary processing steps without resorting to peripheral components and time intensive efforts. For example, analysis of the processing chemicals is required periodically during the plating process. The analysis determines the composition of the electrolyte to ensure proper proportions of the ingredients. Conventional analysis is performed by extracting a sample of electrolyte from a test port and transferring the sample to a remote analyzer. The electrolyte composition is then manually adjusted according to the results of the analysis. The analysis must be performed frequently because the concentrations of the various chemicals are in constant flux. However, the foregoing method is time consuming and limits the number of analyses which can be performed.

Therefore, there remains a need for an electro-chemical deposition system that is designed with a flexible architecture that is expandable to accommodate future designs rules and gap fill requirements and provides satisfactory throughput to meet the demands of other processing systems. There is also a need for an electro-chemical deposition system that provides uniform power distribution and current density across the substrate plating surface to form a metal layer having uniform thickness and maintain a vacuum condition which secures the substrate to the substrate holder during processing. It would be desirable for the system to prevent and/or remove unwanted edge and backside deposition to control contamination to the substrate being processed as well as subsequent substrates. It would also be desirable for the system to include one or more chemical analyzers integrated with the processing system to provide real-time analysis of the electrolyte composition. It would be further desirable for the electro-chemical deposition system to provide a post electrochemical deposition treatment, such as a rapid thermal anneal treatment, for enhancing deposition results.

SUMMARY OF THE INVENTION

The present invention generally provides an electro-chemical deposition system that is designed with a flexible architecture that is expandable to accommodate future designs and gap fill requirements and provides satisfactory throughput to meet the demands of other processing systems. The electro-chemical deposition system generally comprises a mainframe having a mainframe wafer transfer robot, a loading station disposed in connection with the mainframe, one or more processing cells disposed in connection with the mainframe, and an electrolyte supply fluidly connected to the one or more electrical processing cells. Preferably, the electro-chemical deposition system includes a spin-rinse-dry (SRD) station disposed between the loading station and the mainframe, a rapid thermal anneal chamber attached to the loading station, and a system controller for controlling the electro-chemical deposition process and the components of the electro-chemical deposition system.

One aspect of the invention provides an electro-chemical deposition system that provides uniform power distribution and current density across the substrate plating surface to form a metal layer having uniform thickness and maintain a vacuum condition which secures the substrate to the substrate holder during processing.

Another aspect of the invention provides an electro-chemical deposition system that prevents and/or remove unwanted edge and backside deposition to control contamination to the substrate being processed as well as subsequent substrates.

Another aspect of the invention provides an apparatus for electro-chemically depositing a metal onto a substrate comprising a head assembly having a cathode and a wafer holder, a process kit having an electrolyte container and an anode, an electrolyte overflow catch and a power supply connected to the cathode and the anode. Preferably, the cathode includes a cathode contact ring, and the wafer holder includes a bladder system that ensures proper contact of the cathode contact ring to the wafer. Preferably, the surfaces of the cathode contact ring that are exposed to the electrolyte are coated or treated to provide a hydrophilic surface.

Yet another aspect of the invention provides a permeable encapsulated anode adapted to remove anode sludge and other particulates generated by the dissolving anode. Preferably, the encapsulated anode comprises a hydrophilic membrane that traps or filters the contaminates from the electrolyte. The encapsulated anode also preferably includes a bypass electrolyte inlet and a bypass outlet to facilitate flow of the electrolyte inside the encapsulated anode.

Still another aspect of the invention provides an electrolyte replenishing system having a real-time chemical analyzer module and a dosing module. The chemical analyzer module includes at least one and preferably two analyzers operated by a controller and integrated with a control system of the electro-chemical deposition system. A sample line provides continuous flow of electrolyte from a main electrolyte tank to the chemical analyzer module. A first analyzer determines the concentrations of organic substances in the electrolyte while the second analyzer determines the concentrations of inorganic substances. The dosing module is then activated to deliver the proper proportions of chemicals to the main tank in response to the information obtained by the chemical analyzer module.

Yet another aspect of the invention provides a post electrochemical deposition treatment, such as a rapid thermal anneal treatment, for enhancing deposition results. The apparatus for rapid thermal anneal treatment preferably comprises a rapid thermal anneal chamber disposed adjacent the loading station of the electrochemical deposition system.

Yet another aspect of the invention provides a rotatable head assembly for an electroplating cell that provides rotation of the wafer during processing to improve deposition uniformity. The rotatable head assembly also enhances removal of residual electrolytes from the wafer holder assembly after the electroplating process. Preferably, the components of the wafer holder assembly, including the inflatable bladder and the cathode contact ring has hydrophilic surfaces to enhance dripping and removal of the residual electrolyte.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
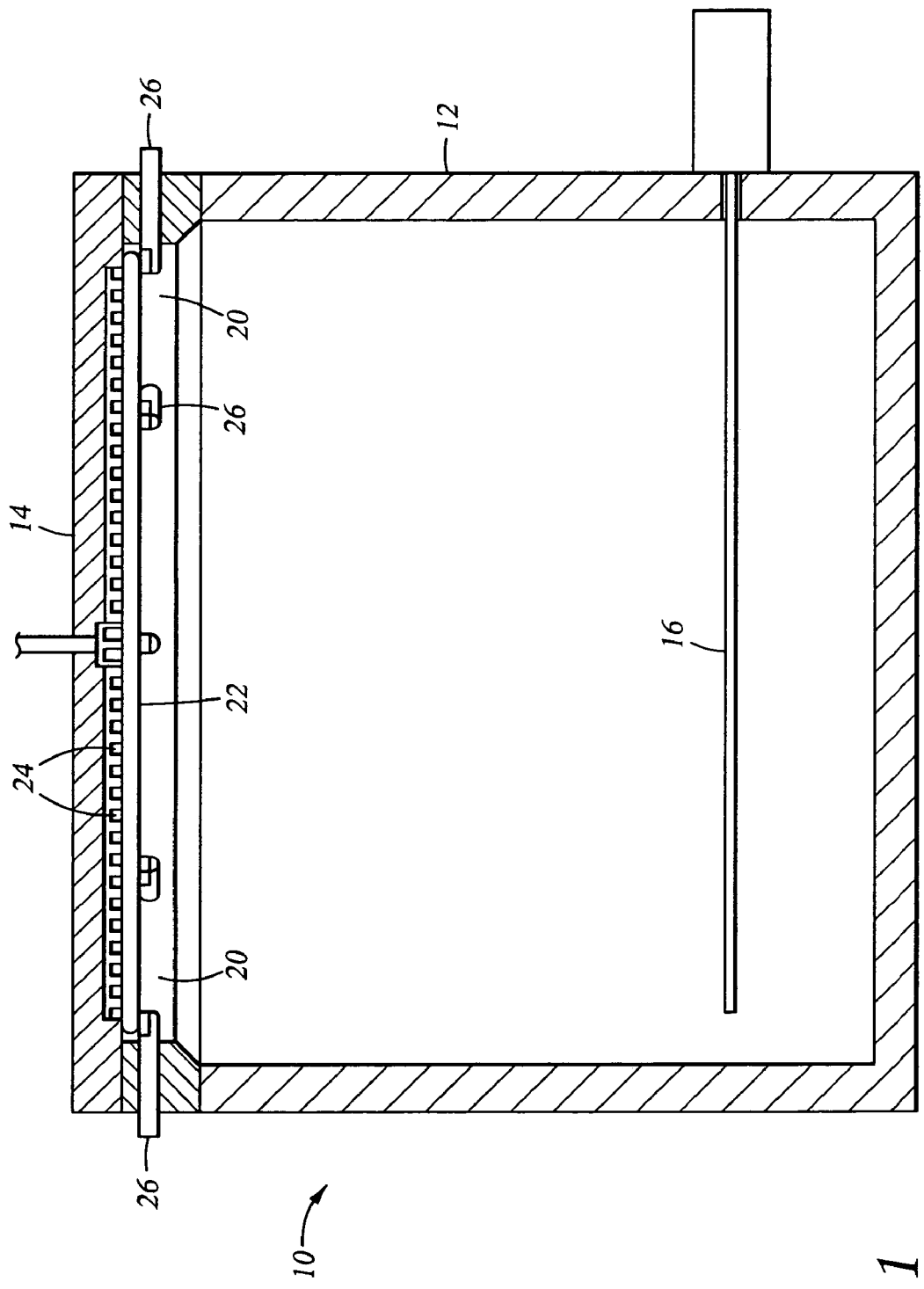

FIG. 1 is a cross sectional view of a simplified typical fountain plater 10 incorporating contact pins.

Figure 2:
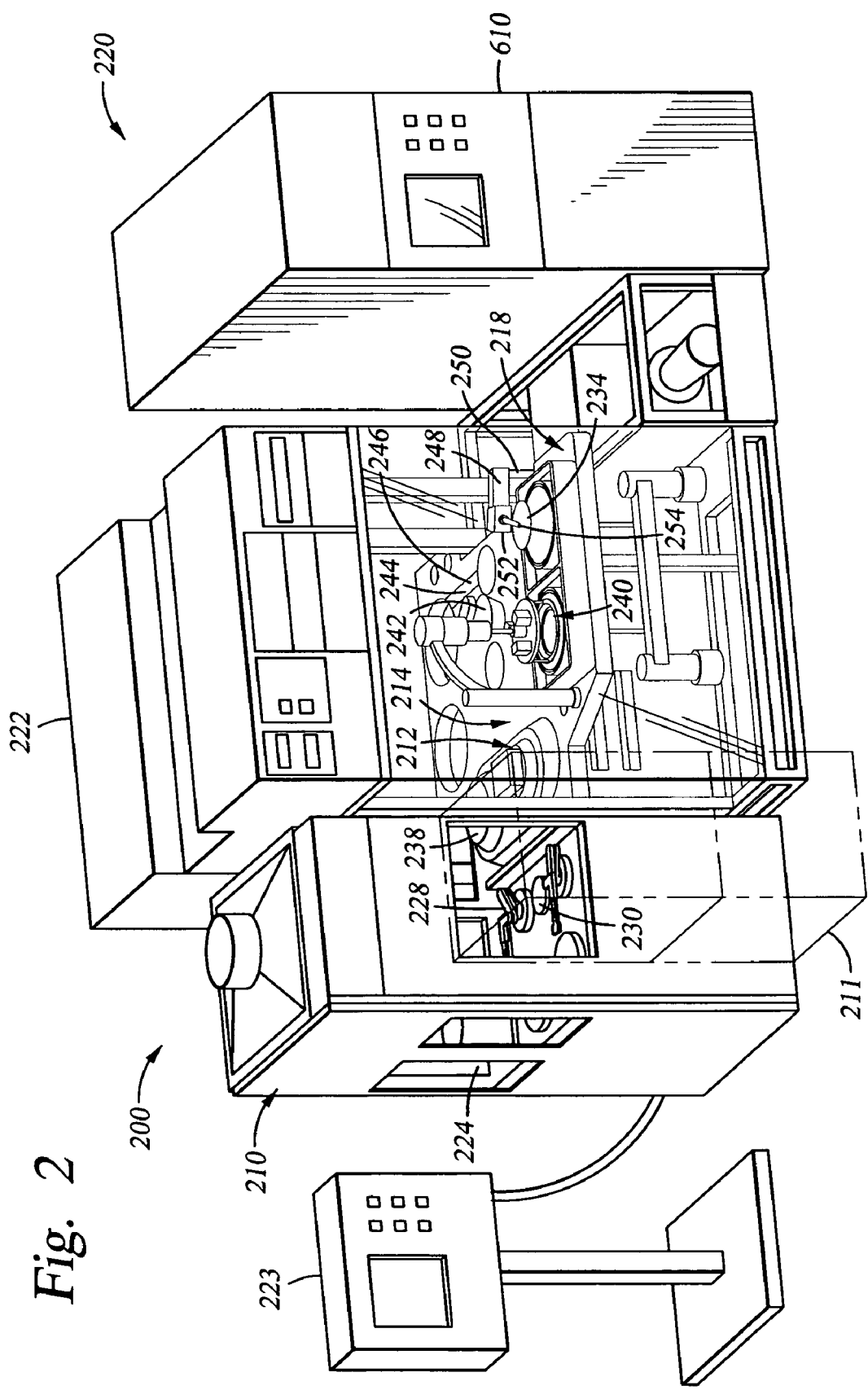

FIG. 2 is a perspective view of an electroplating system platform 200 of the invention.

Figure 3:
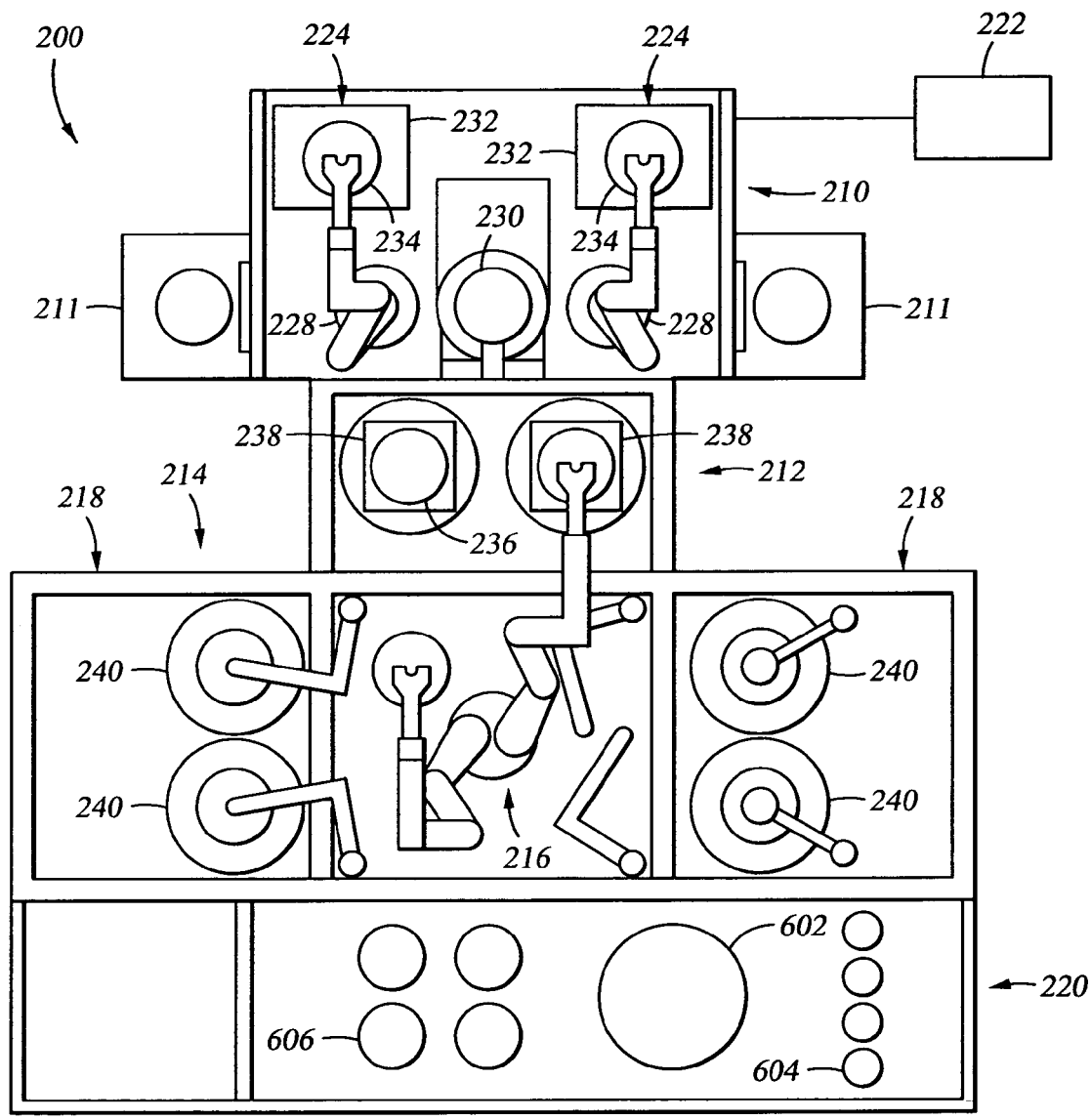

FIG. 3 is a schematic view of an electroplating system platform 200 of the invention.

Figure 4:
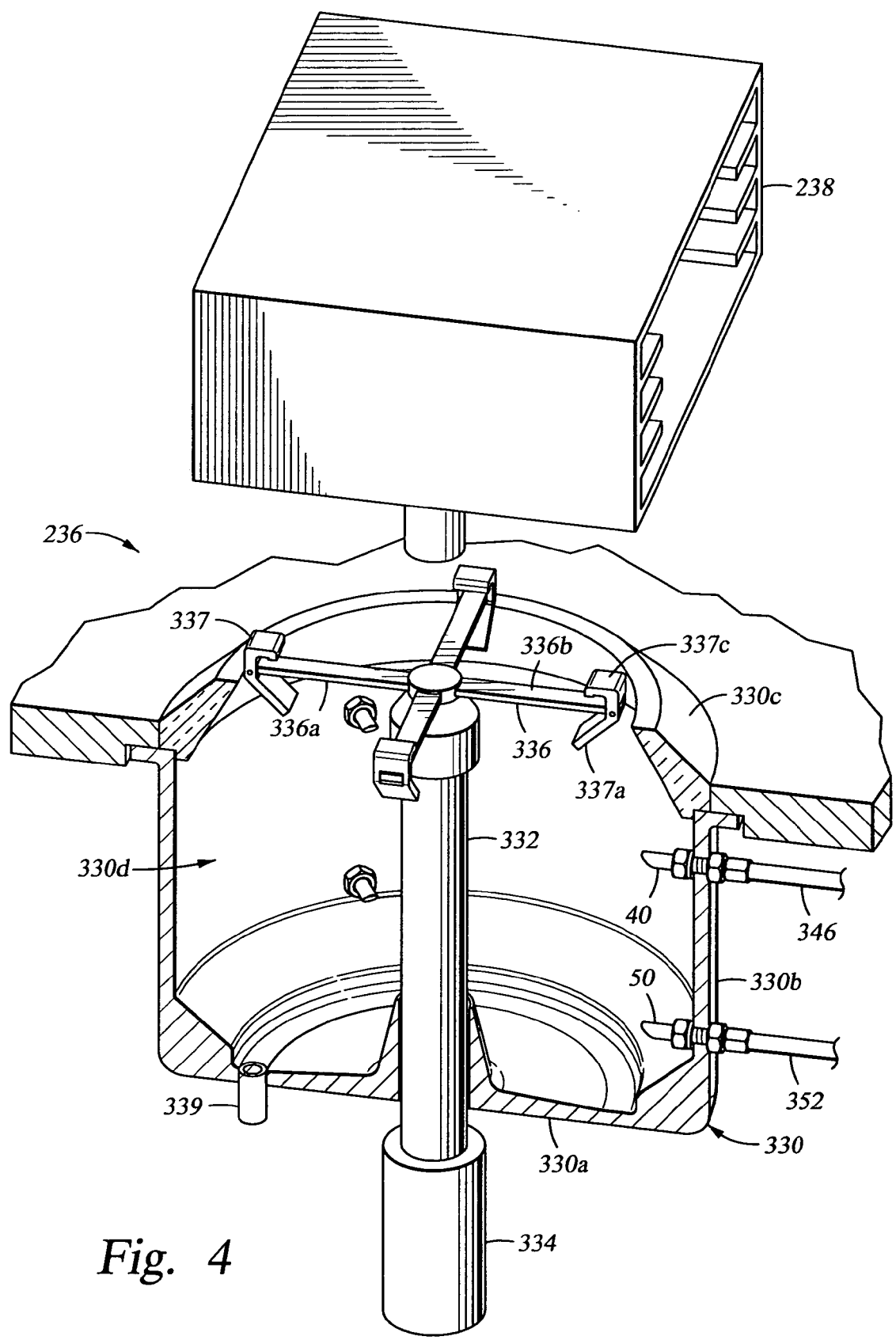

FIG. 4 is a schematic perspective view of a spin-rinse-dry (SRD) module of the present invention, incorporating rinsing and dissolving fluid inlets.

Figure 5:
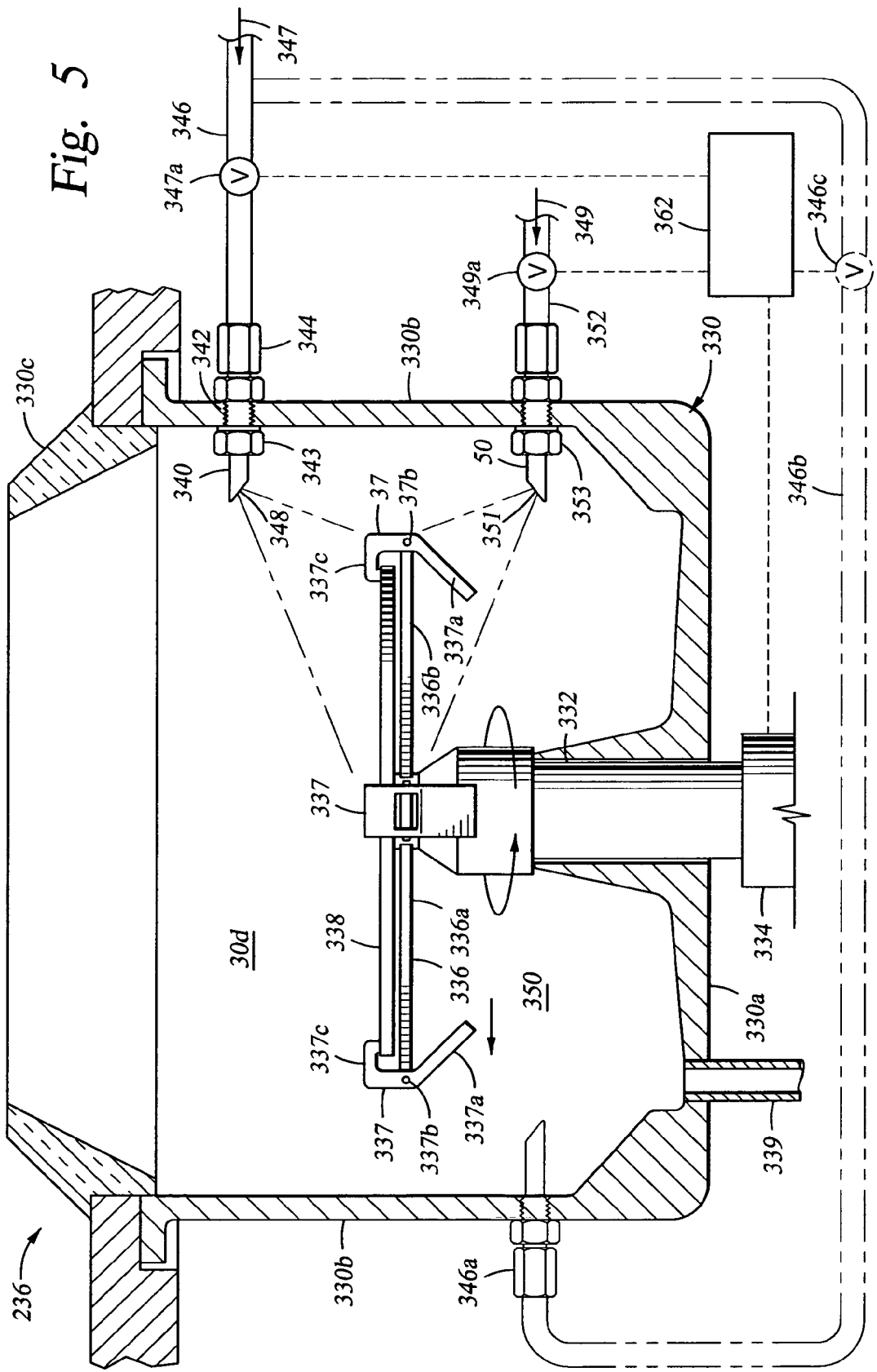

FIG. 5 is a side cross sectional view of the spin-rinse-dry (SRD) module of FIG. 4 and shows a substrate in a processing position vertically disposed between fluid inlets.

Figure 6:
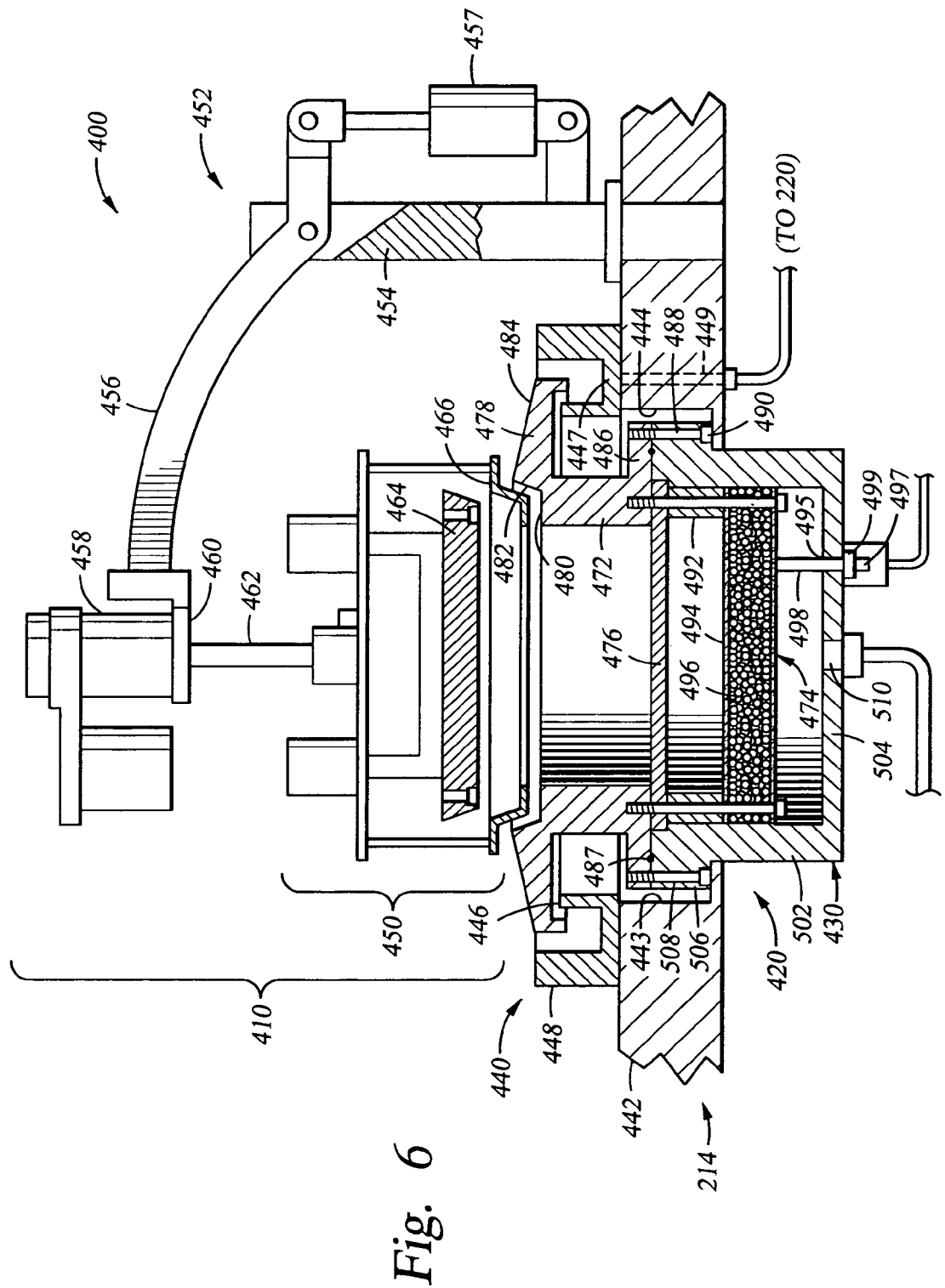

FIG. 6 is a cross sectional view of an electroplating process cell 400 according to the invention.

Figure 7:
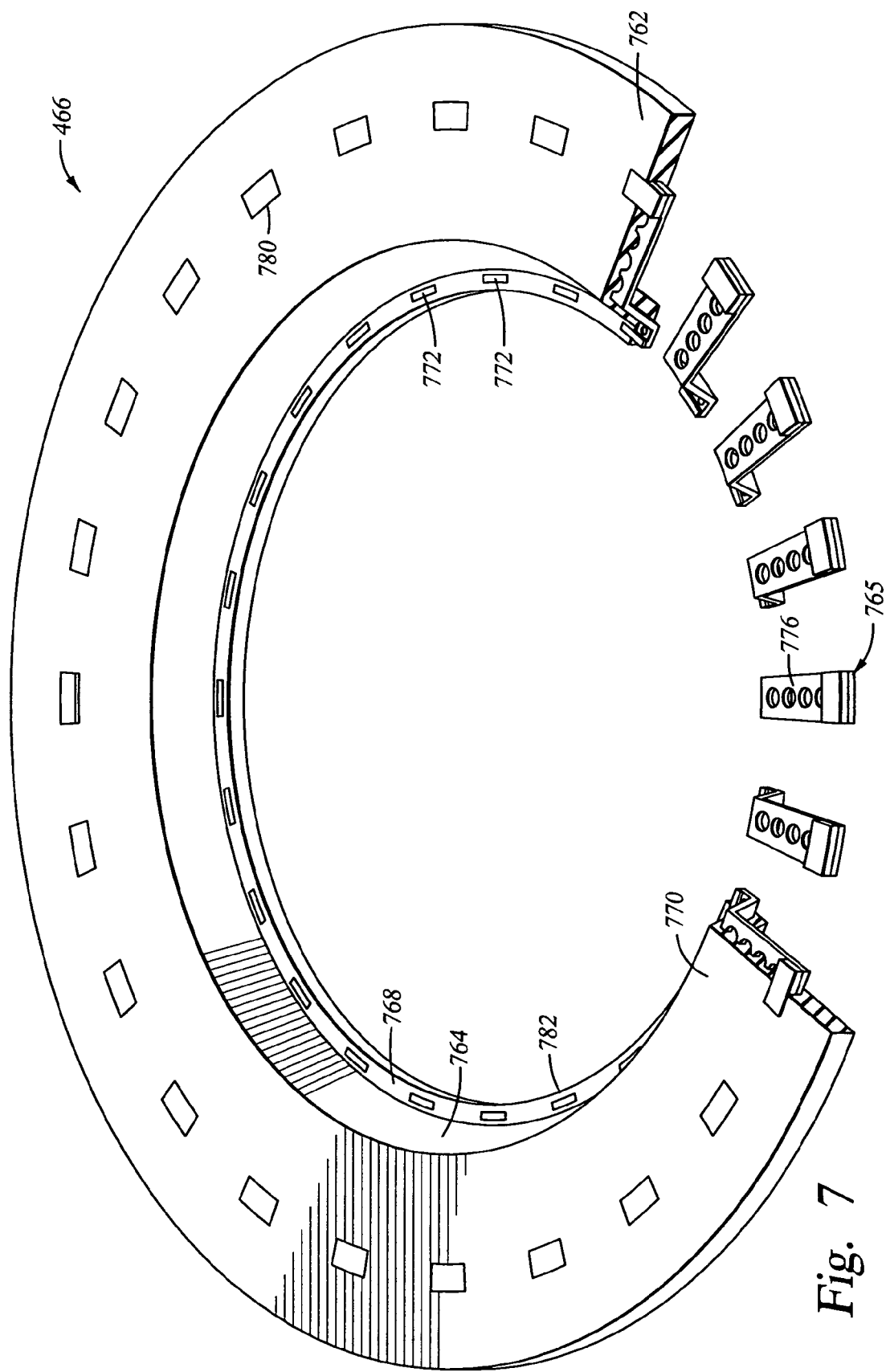

FIG. 7 is a partial cross sectional perspective view of a cathode contact ring.

Figures 8, 9:
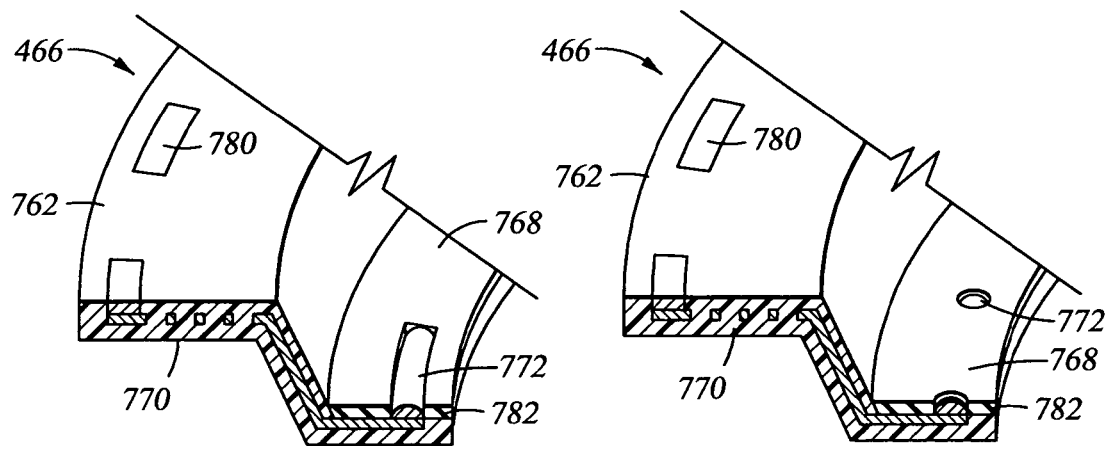

FIG. 8 is a cross sectional perspective view of the cathode contact ring showing an alternative embodiment of contact pads.

FIG. 9 is a cross sectional perspective view of the cathode contact ring showing an alternative embodiment of the contact pads and an isolation gasket.

Figure 10:
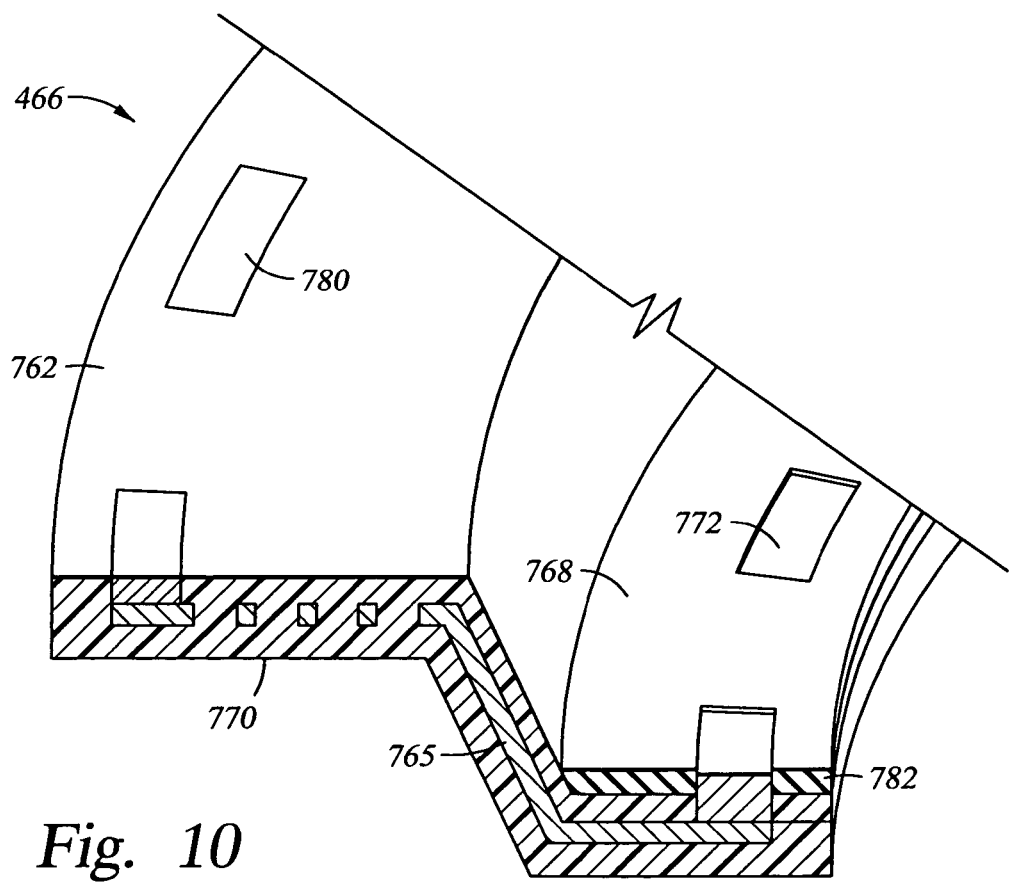

FIG. 10 is a cross sectional perspective view of the cathode contact ring showing the isolation gasket.

Figure 11:
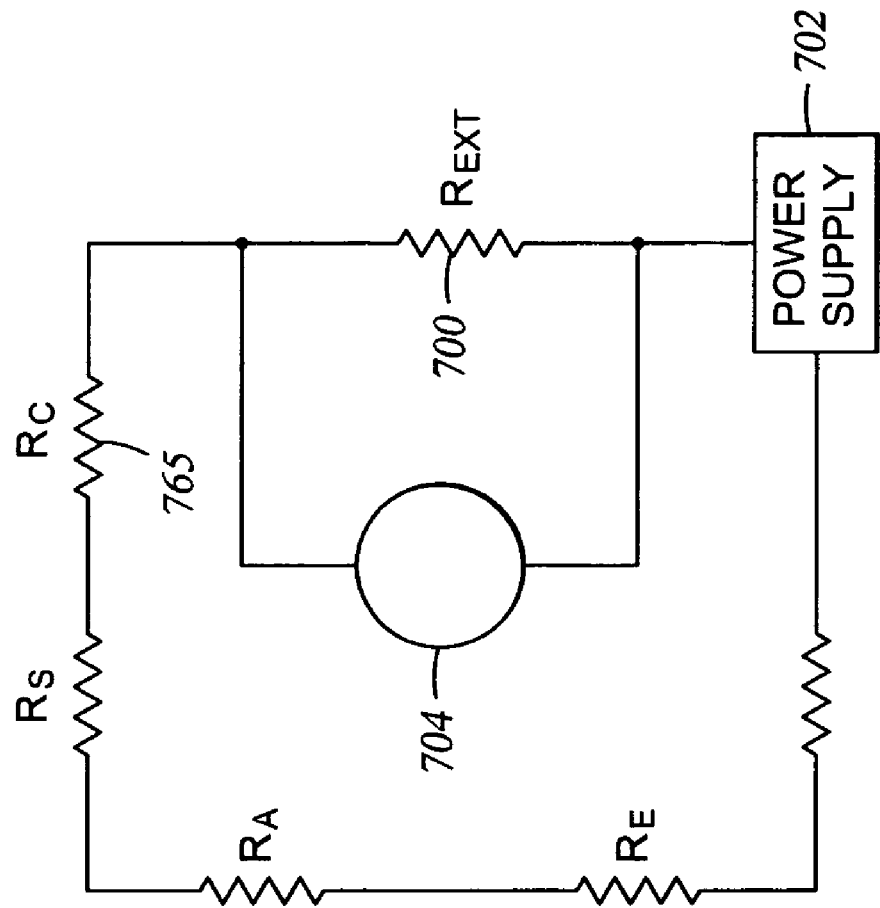

FIG. 11 is a simplified schematic diagram of the electrical circuit representing the electroplating system through each contact pin.

Figure 12:
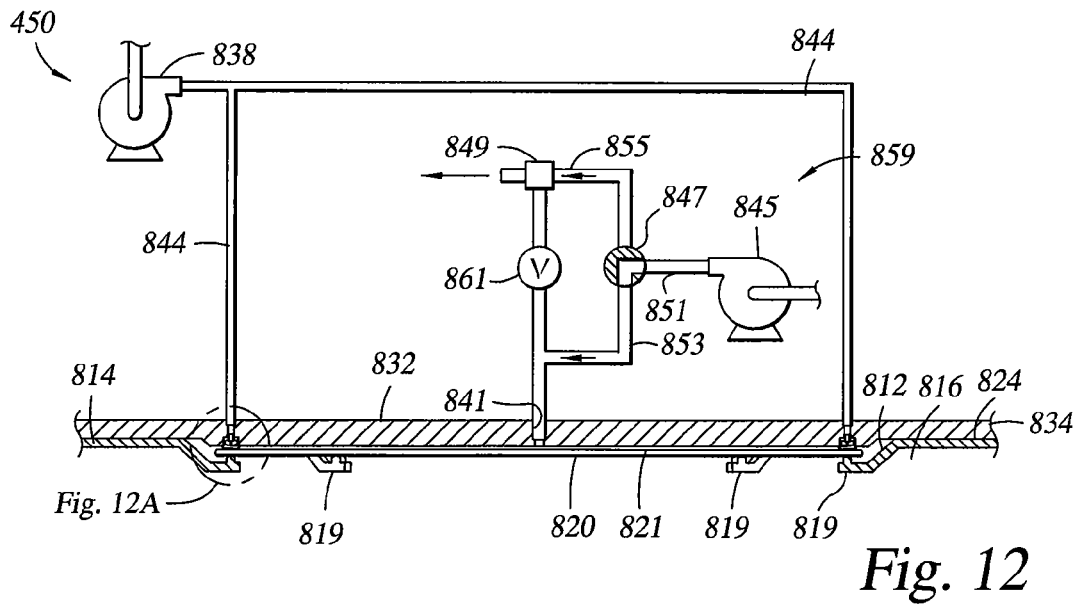

FIG. 12 is a cross sectional view of a wafer assembly 450 of the invention.

Figure 12A:
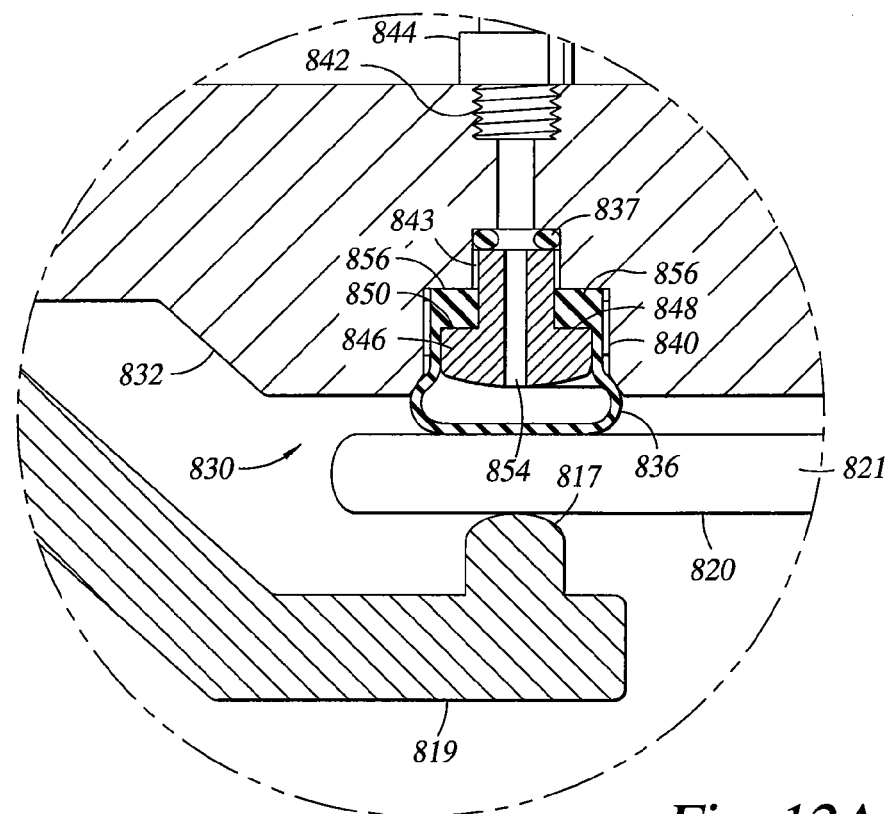

FIG. 12A is an enlarged cross sectional view of the bladder area of FIG. 12.

Figure 13:
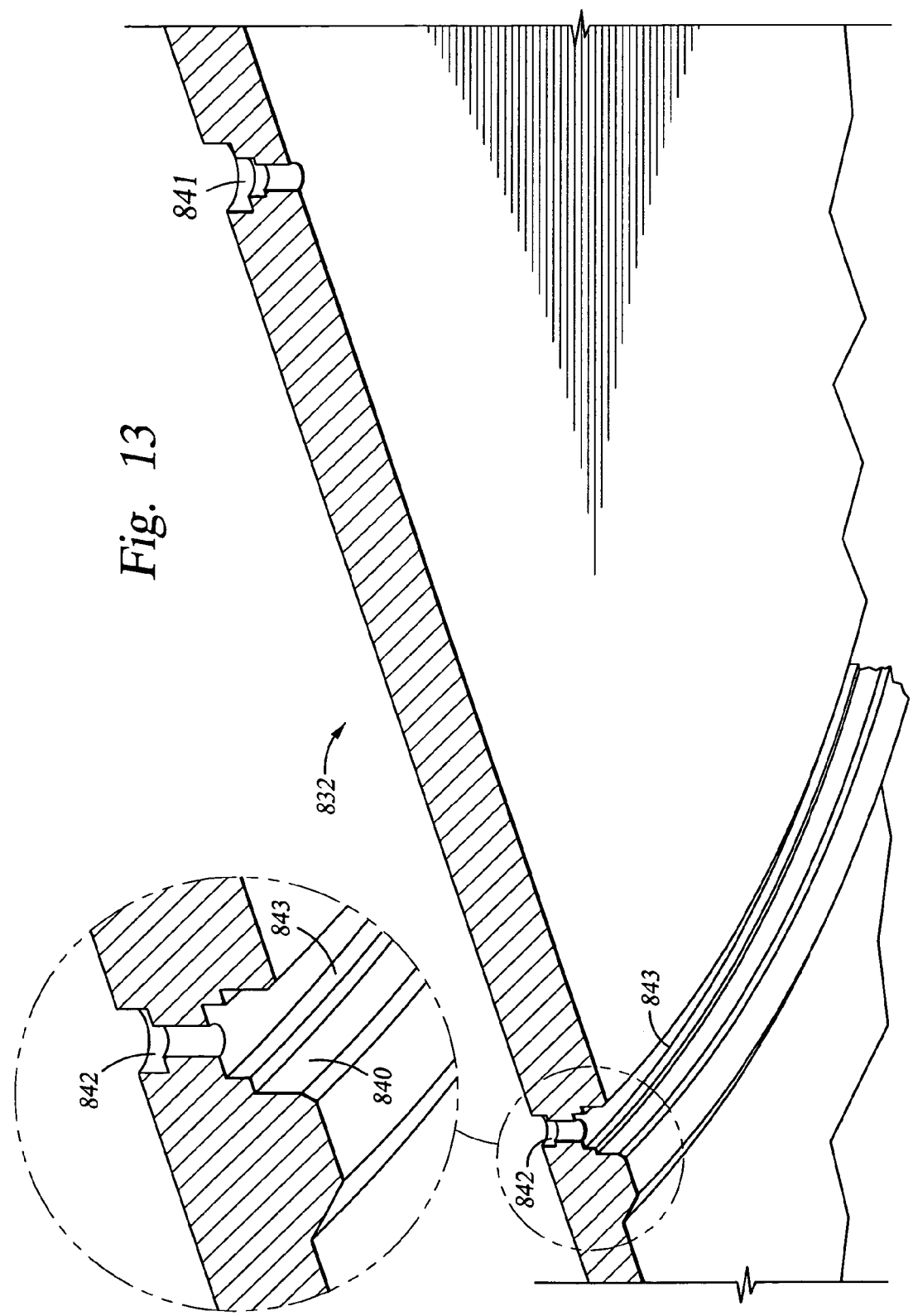

FIG. 13 is a partial cross sectional view of a wafer holder plate.

Figure 14:
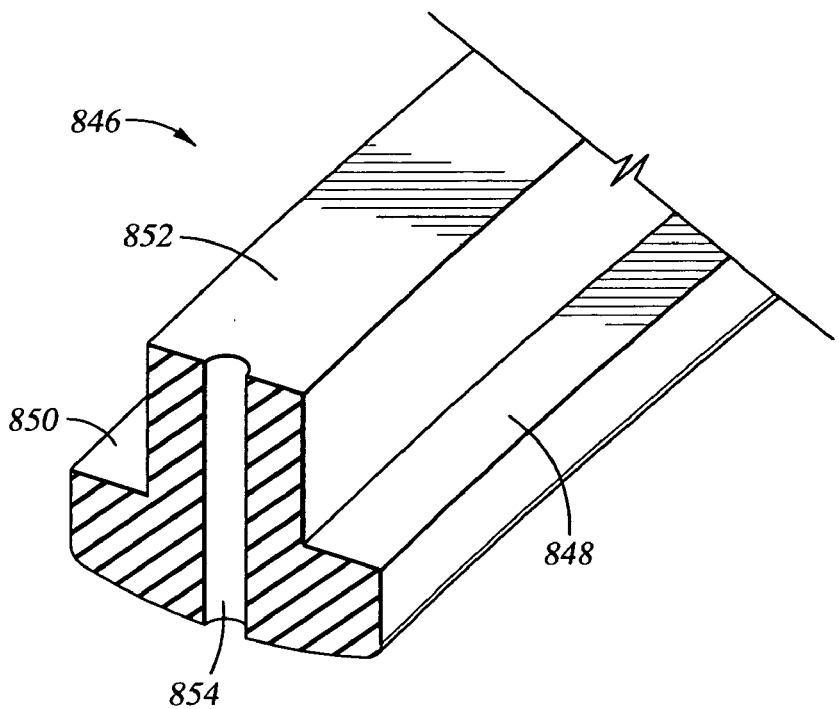

FIG. 14 is a partial cross sectional view of a manifold.

Figure 15:
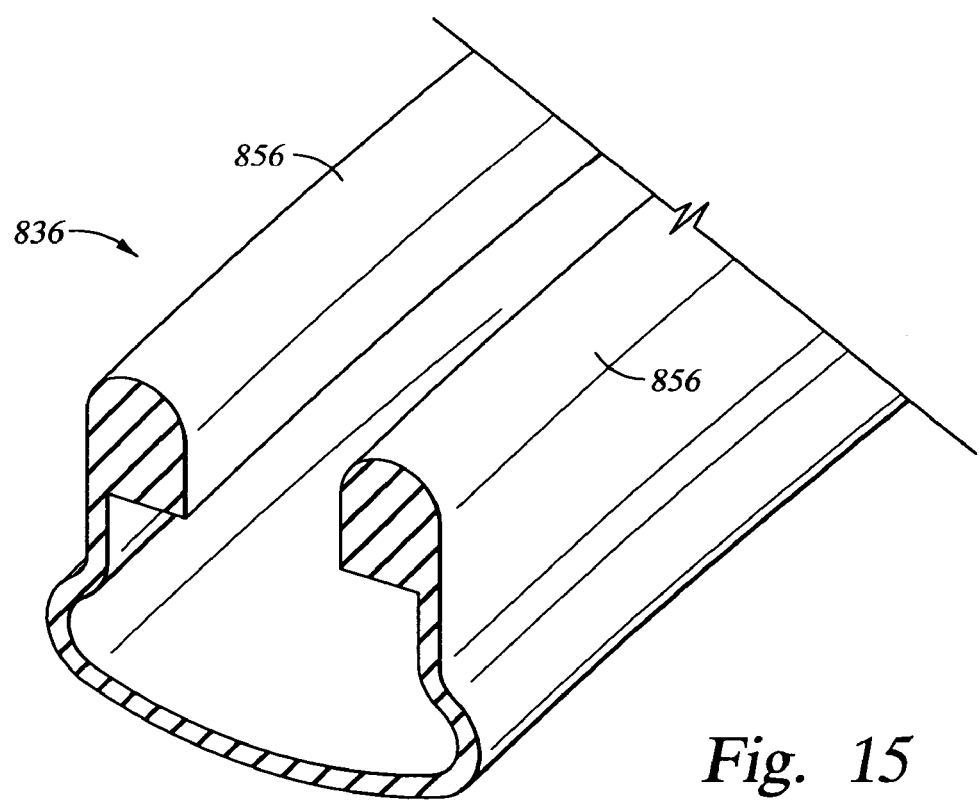

FIG. 15 is a partial cross sectional view of a bladder.

Figure 16:
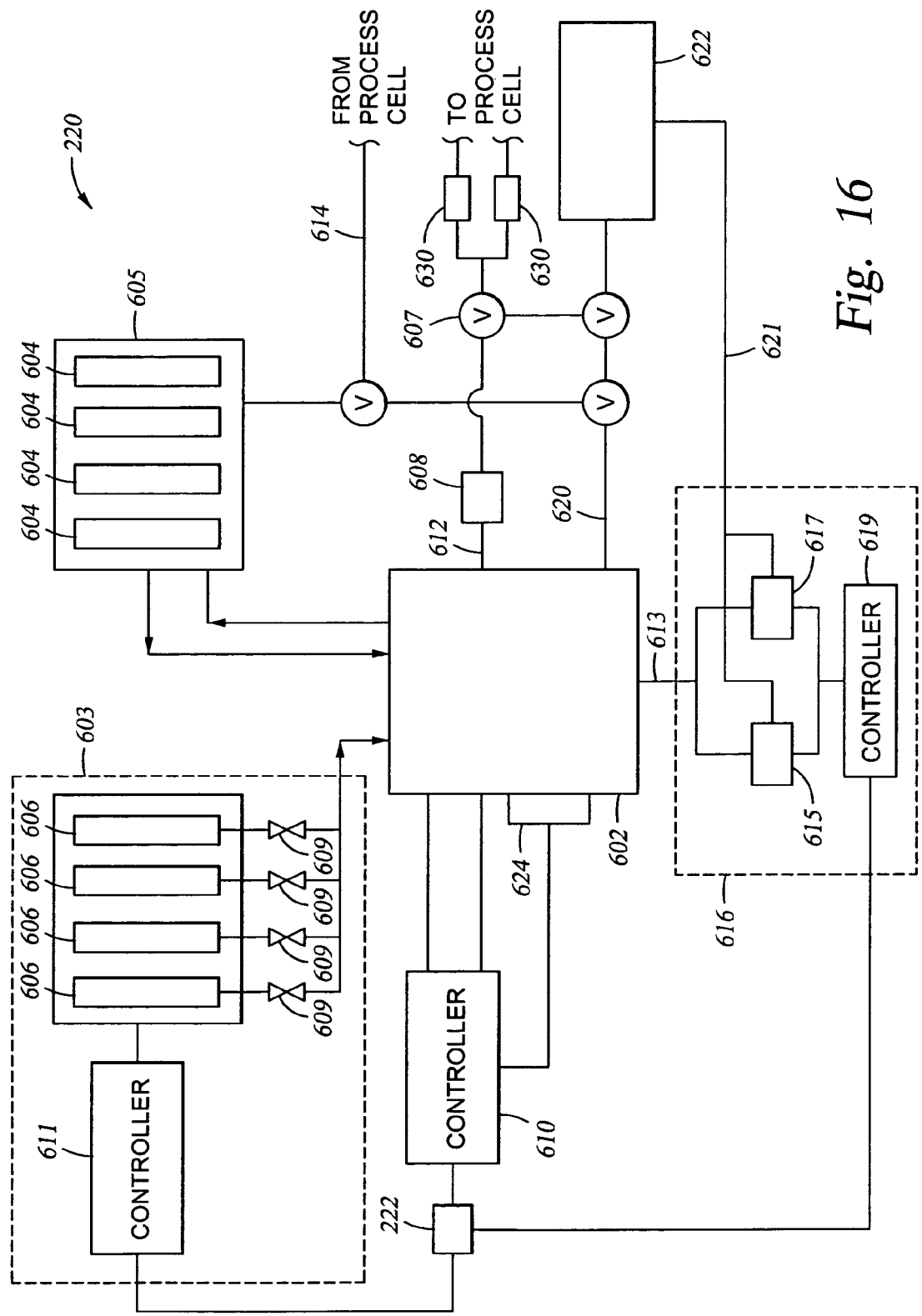

FIG. 16 is a schematic diagram of an electrolyte replenishing system 220.

Figure 17:
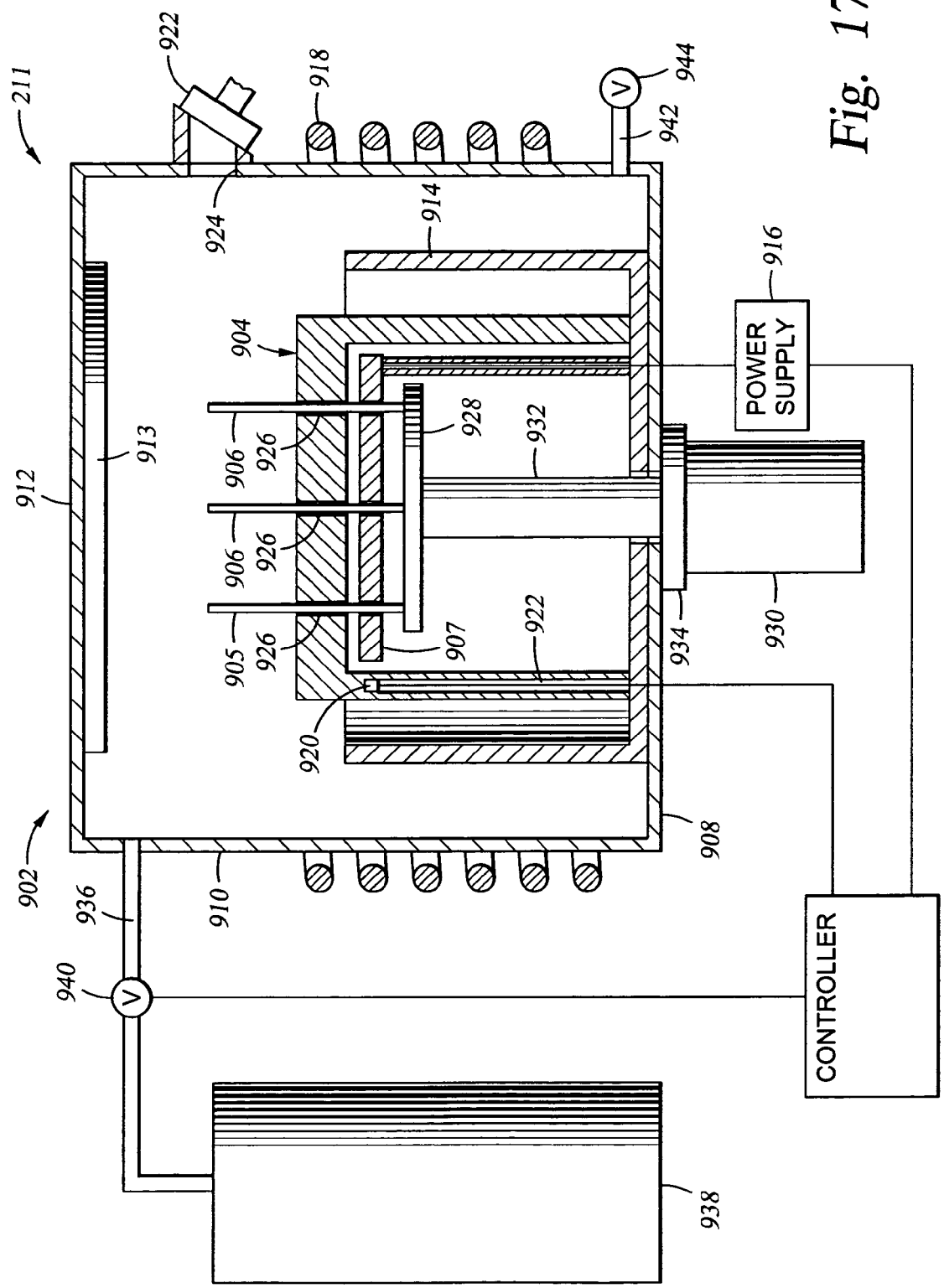

FIG. 17 is a cross sectional view of a rapid thermal anneal chamber.

Figure 18:
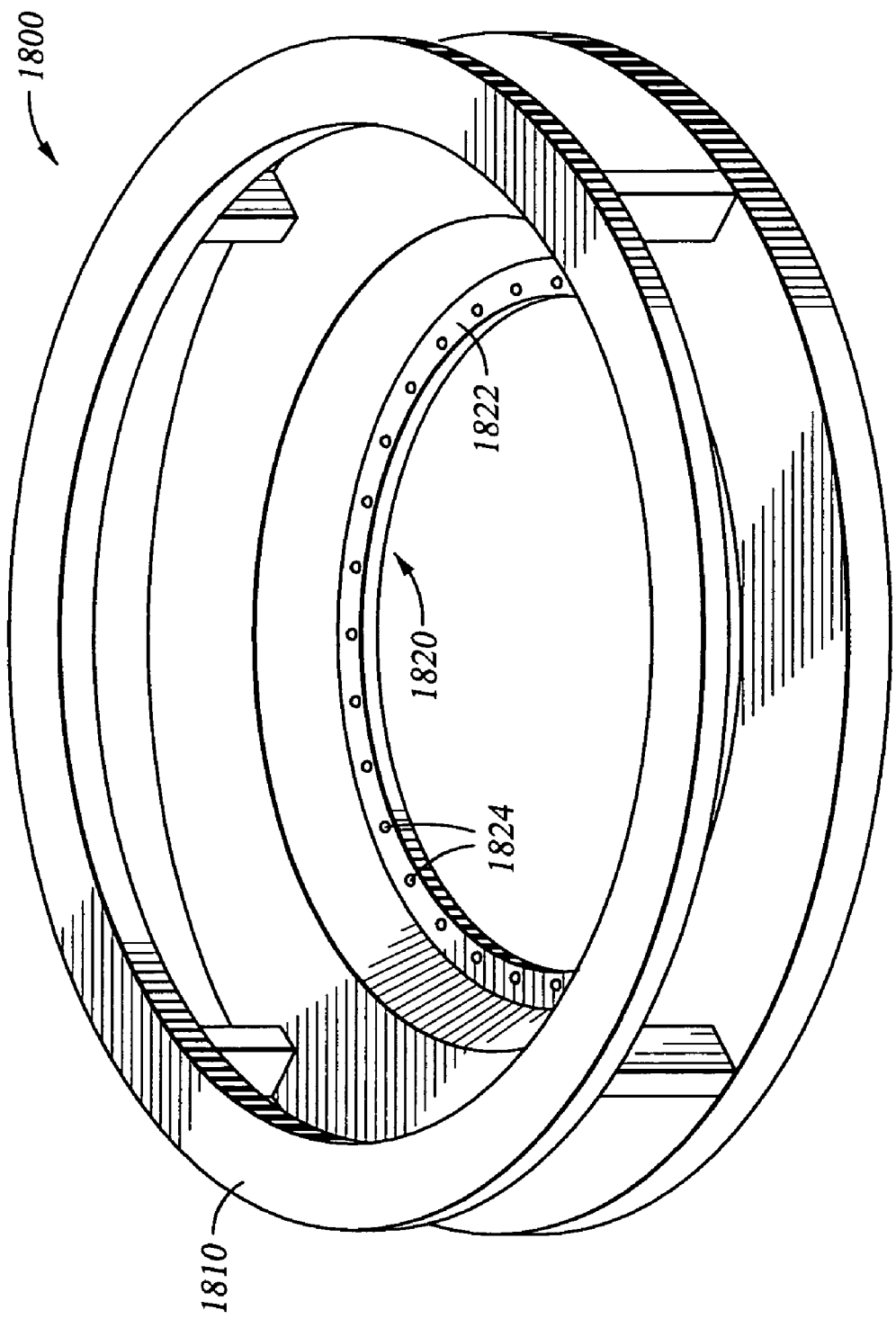

FIG. 18 is a perspective view of an alternative embodiment of a cathode contact ring.

Figure 19:
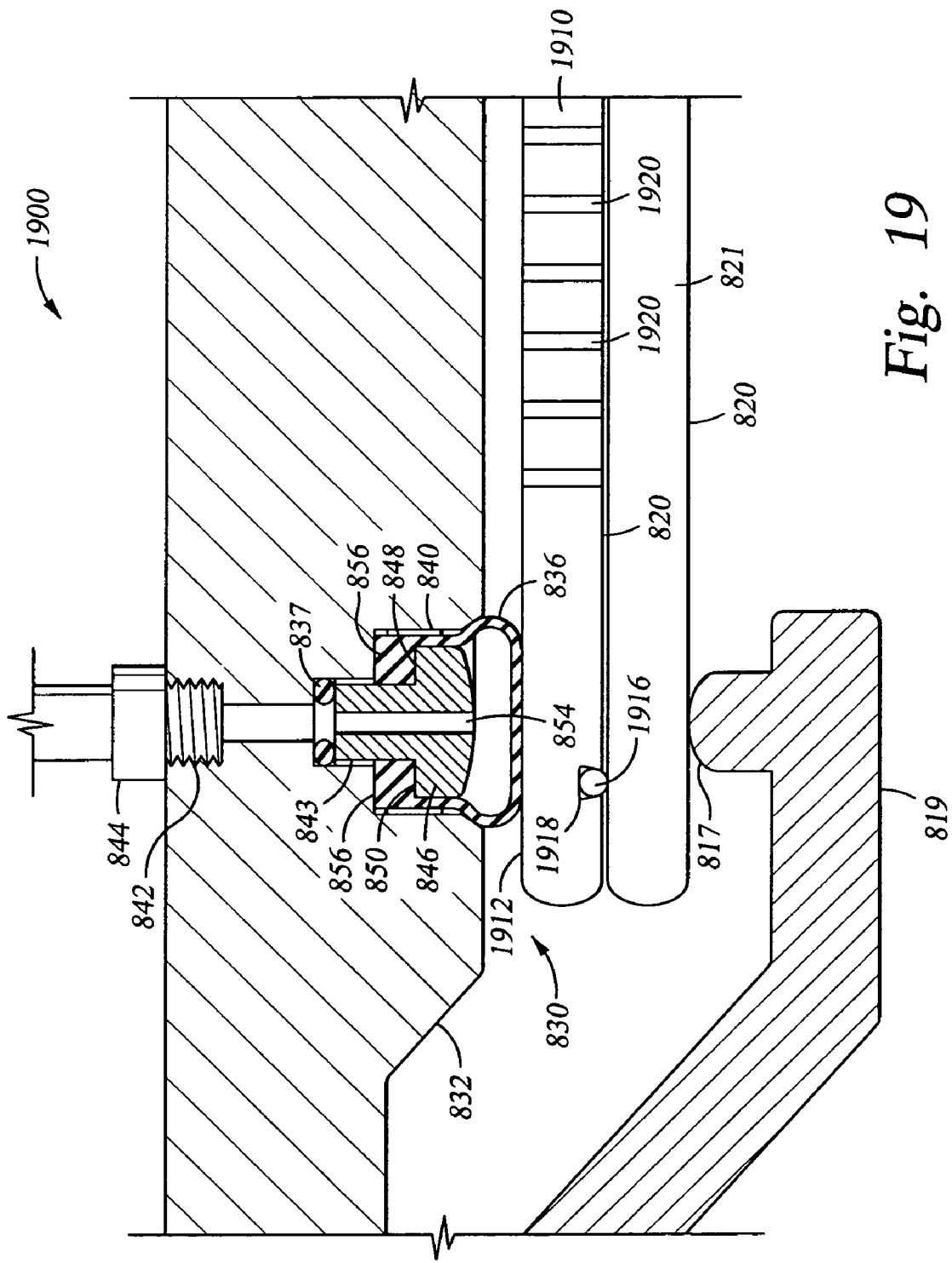

FIG. 19 is a partial cross sectional view of an alternative embodiment of a wafer holder assembly.

Figure 20:
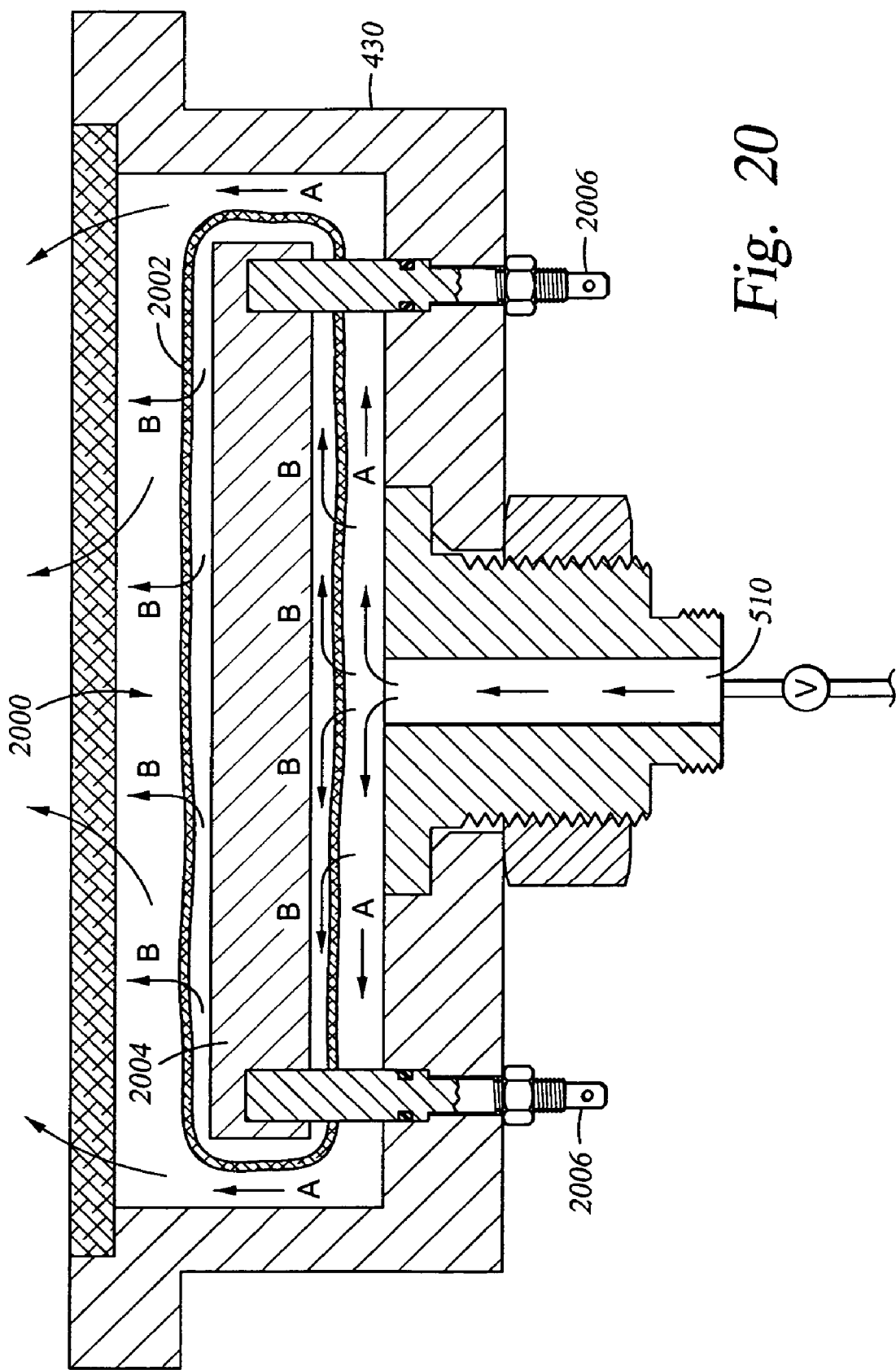

FIG. 20 is a cross sectional view of a first embodiment of an encapsulated anode.

Figure 21:
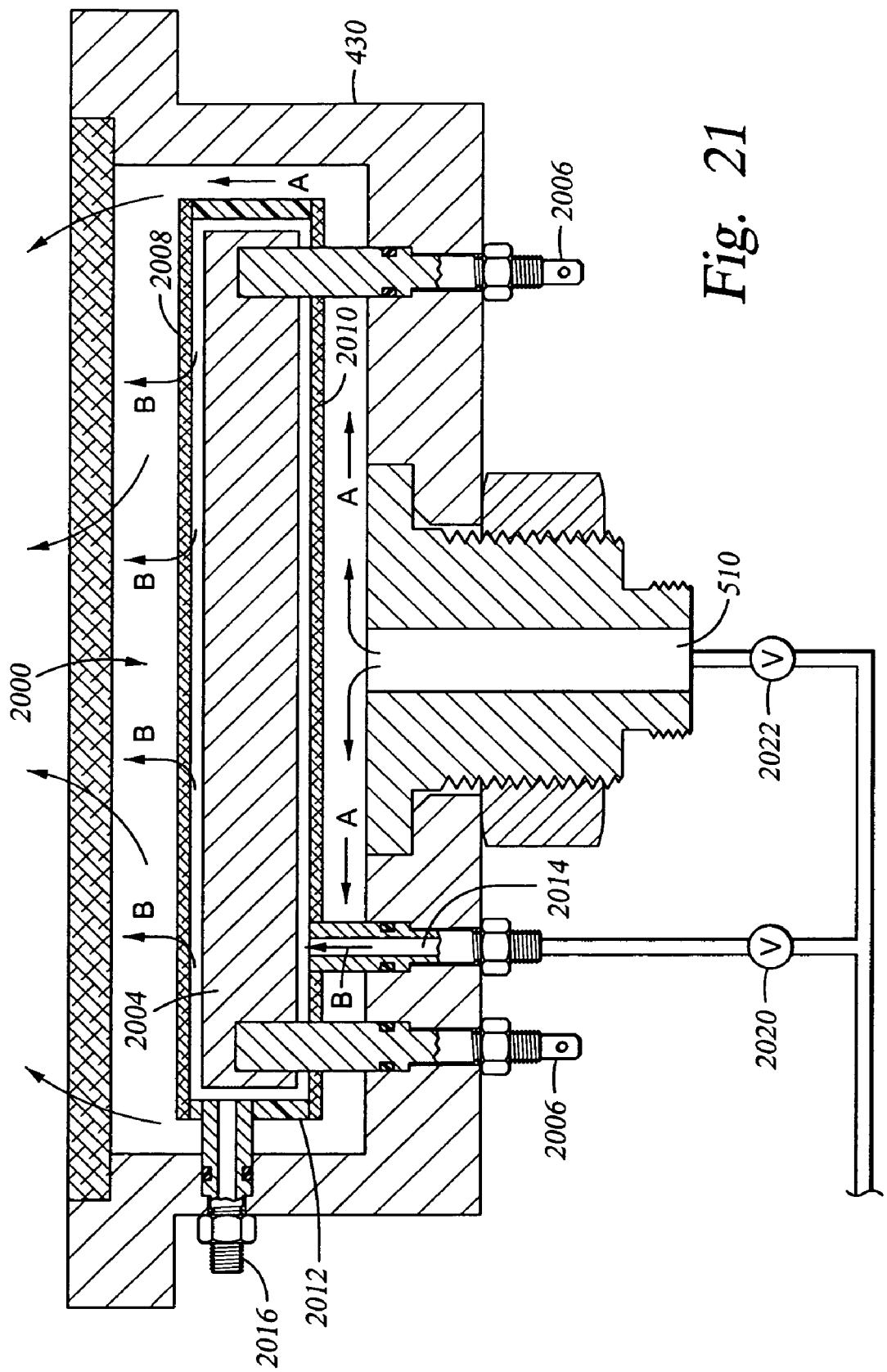

FIG. 21 is a cross sectional view of a second embodiment of an encapsulated anode.

Figure 22:
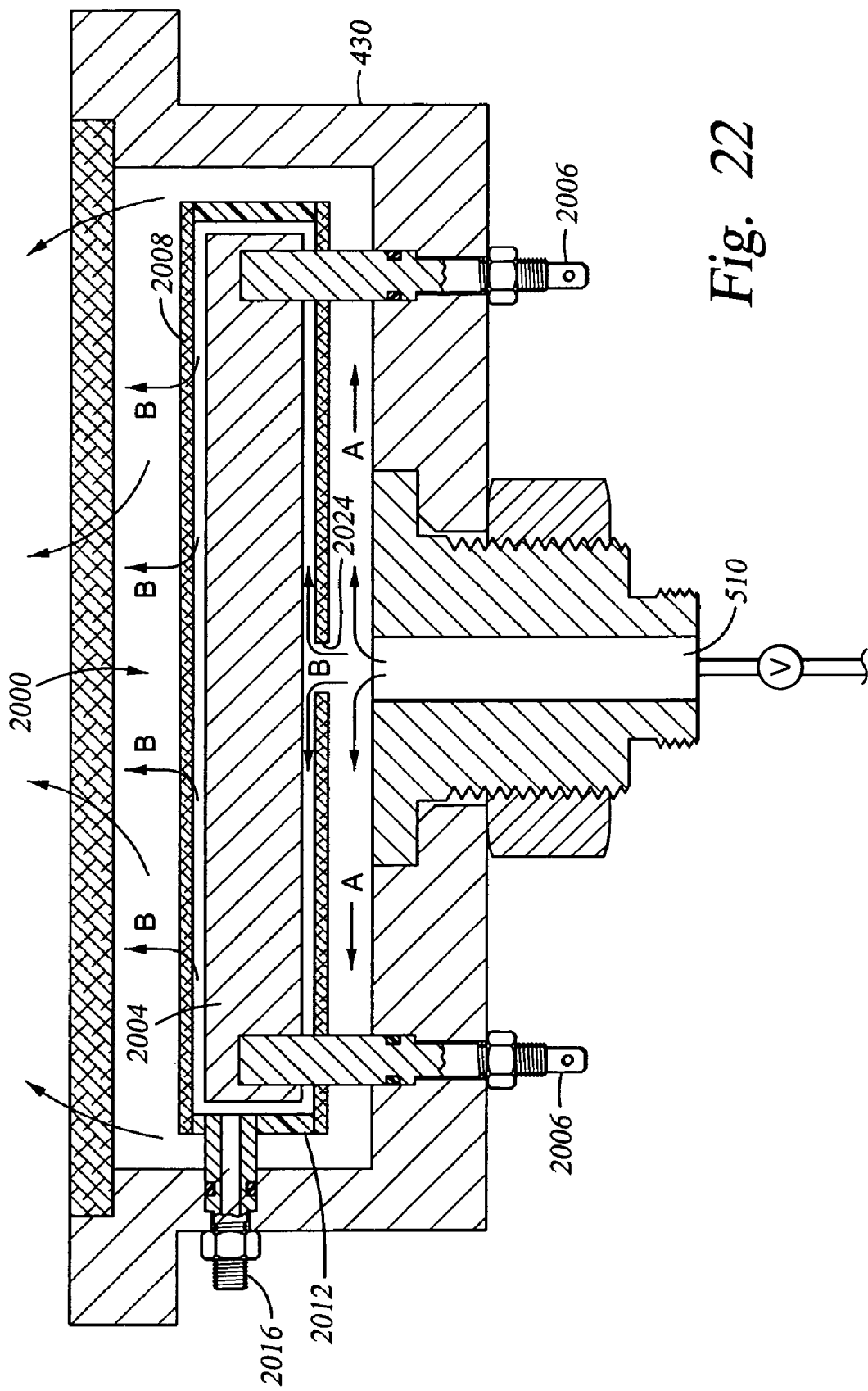

FIG. 22 is a cross sectional view of a third embodiment of an encapsulated anode.

Figure 23:
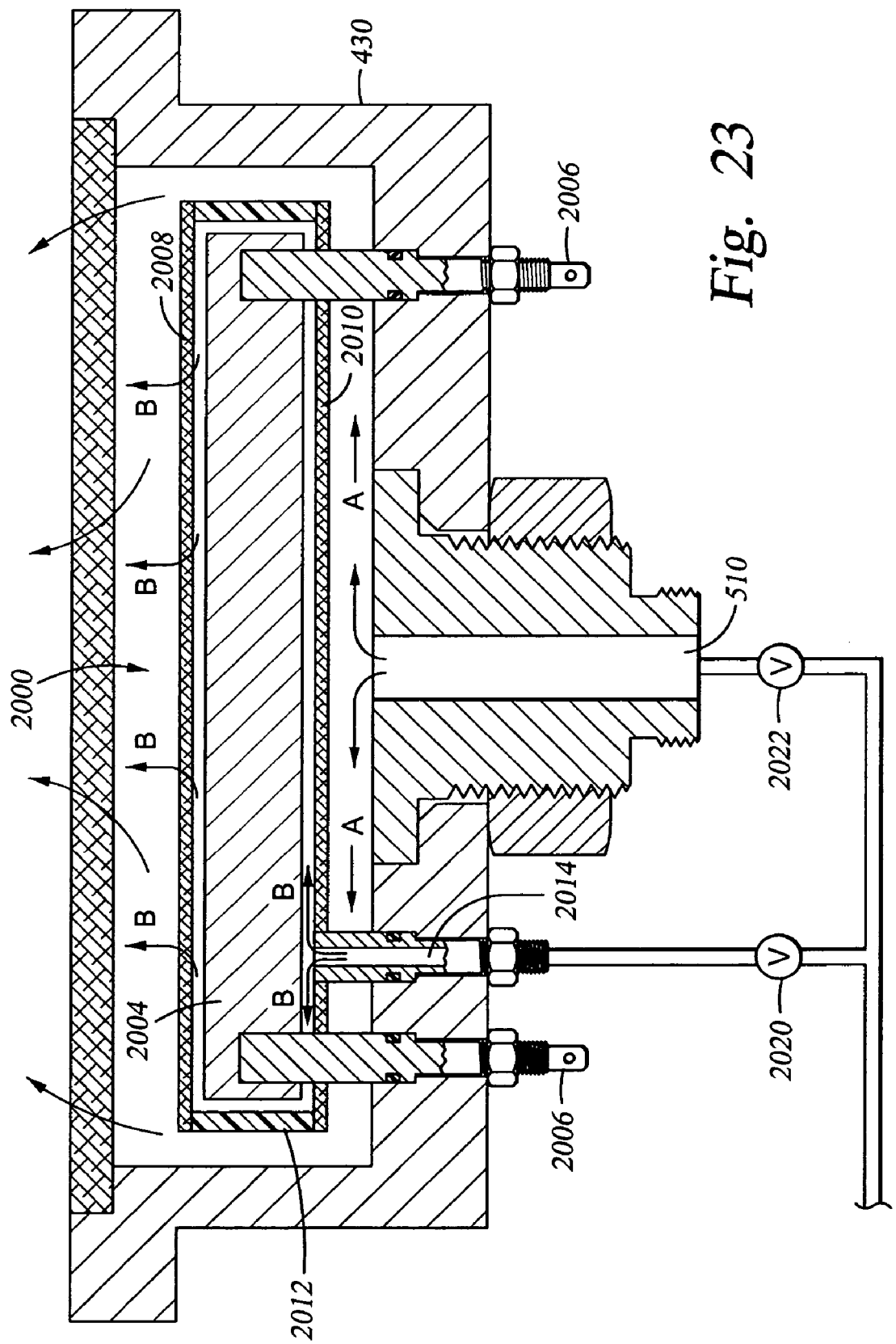

FIG. 23 is a cross sectional view of a fourth embodiment of an encapsulated anode.

Figure 24:
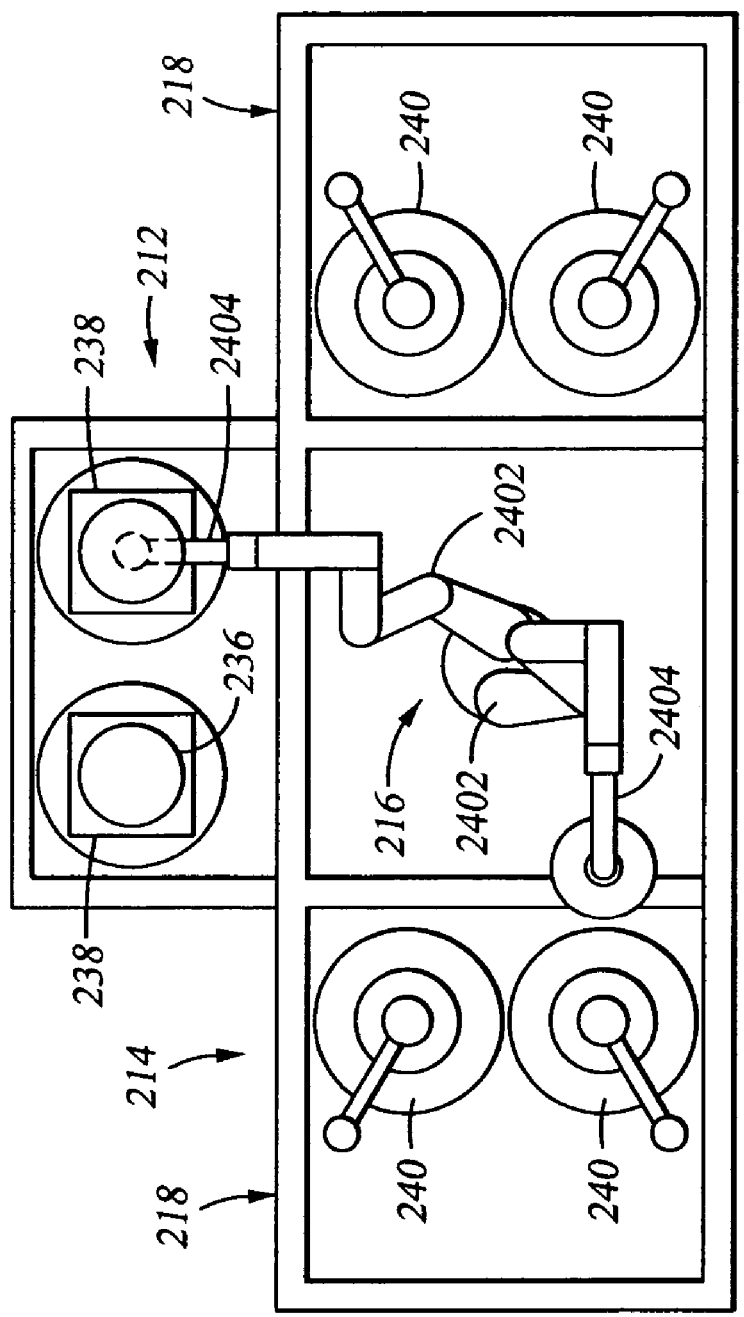

FIG. 24 is a top schematic view of a mainframe transfer robot having a flipper robot incorporated therein.

Figure 25:
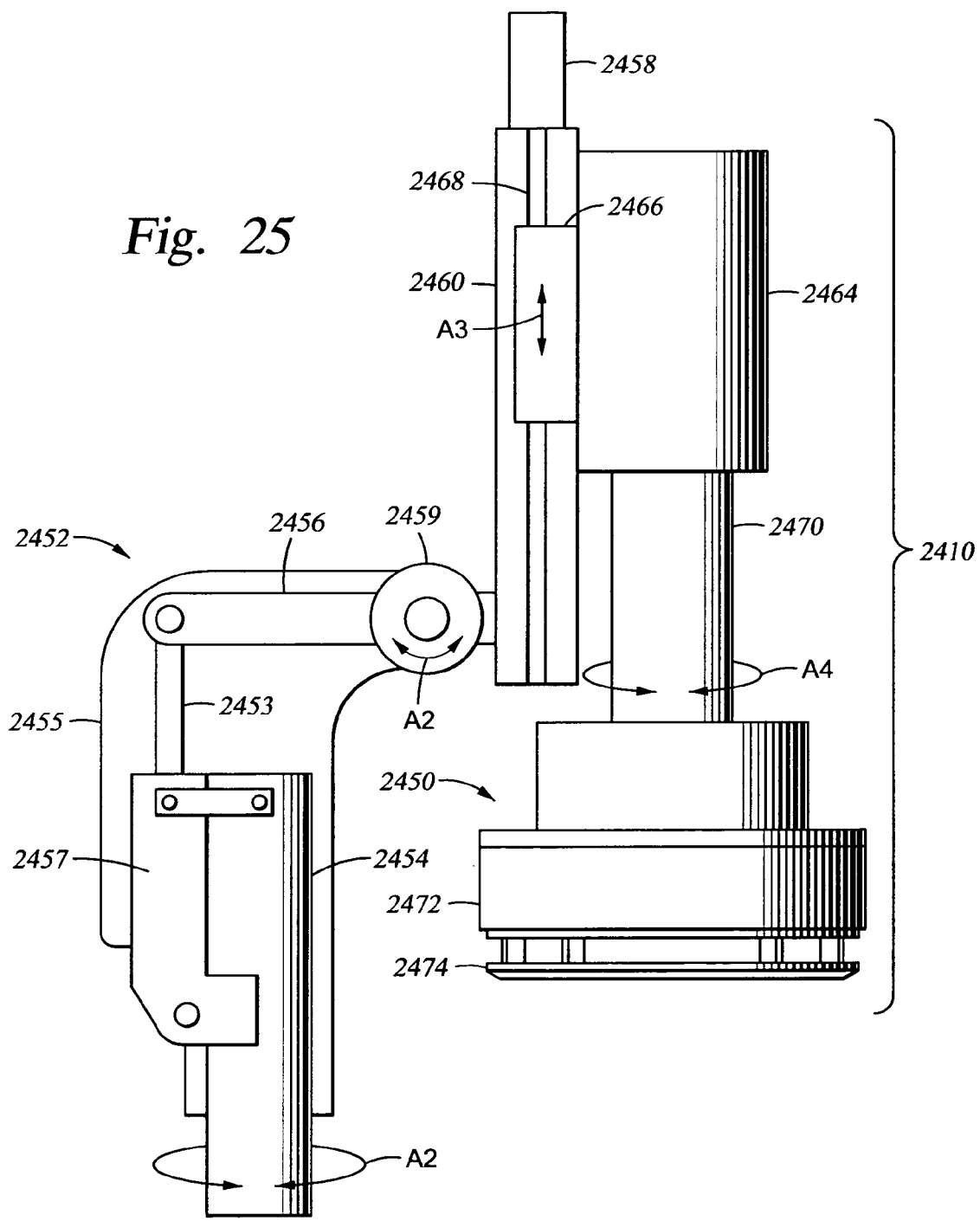

FIG. 25 is an alternative embodiment of the process head assembly having a rotatable head assembly 2410.

Figure 26A:
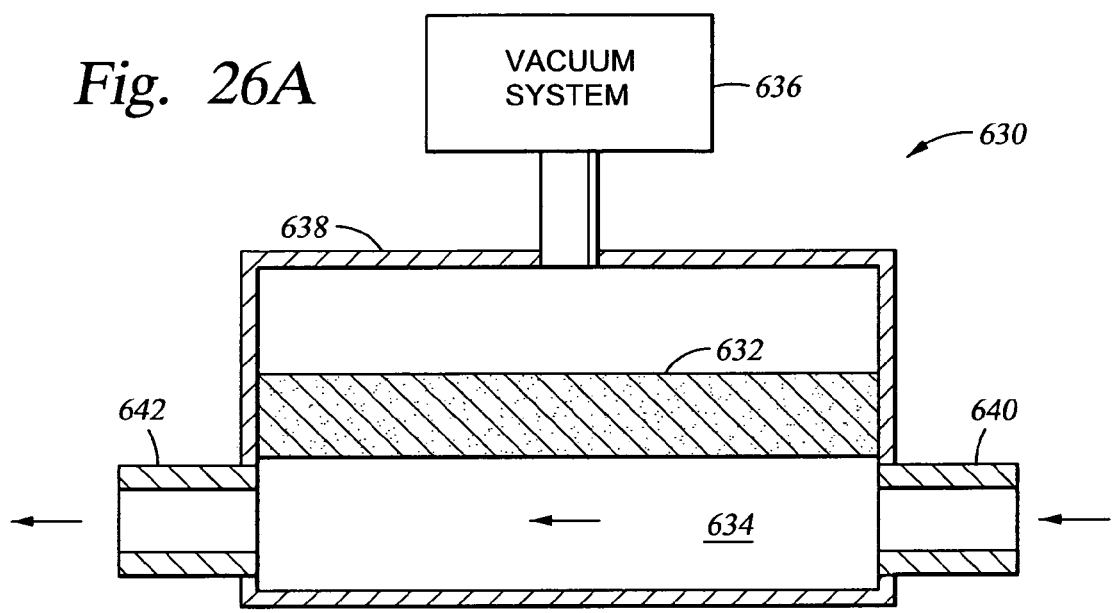
Figure 26B:
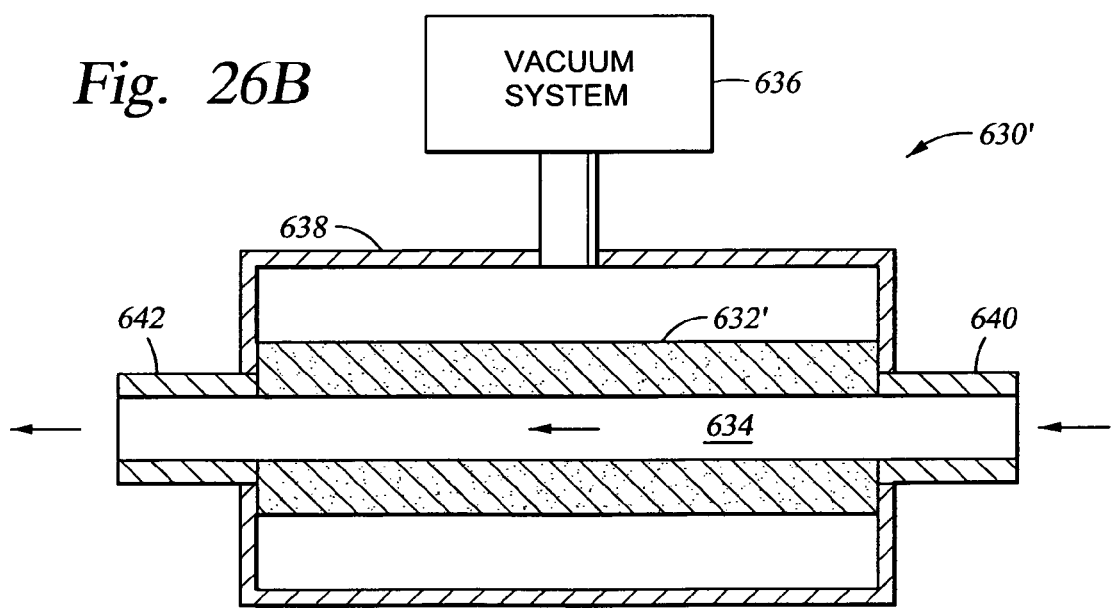

FIGS. 26a and 26b are cross sectional views of embodiments of a degasser module.

DETAILED DESCRIPTION OF THE PREFERRED EMBODIMENT

FIG. 2 is a perspective view of an electroplating system platform 200 of the invention. FIG. 3 is a schematic view of an electroplating system platform 200 of the invention. Referring to both FIGS. 2 and 3, the electroplating system platform 200 generally comprises a loading station 210, a thermal anneal chamber 211, a spin-rinse-dry (SRD) station 212, a mainframe 214, and an electrolyte replenishing system 220. Preferably, the electroplating system platform 200 is enclosed in a clean environment using panels such as plexiglass panels. The mainframe 214 generally comprises a mainframe transfer station 216 and a plurality of processing stations 218. Each processing station 218 includes one or more processing cells 240. An electrolyte replenishing system 220 is positioned adjacent the electroplating system platform 200 and connected to the process cells 240 individually to circulate electrolyte used for the electroplating process. The electroplating system platform 200 also includes a control system 222, typically comprising a programmable microprocessor.

The loading station 210 preferably includes one or more wafer cassette receiving areas 224, one or more loading station transfer robots 228 and at least one wafer orientor 230. The number of wafer cassette receiving areas, loading station transfer robots 228 and wafer orientor included in the loading station 210 can be configured according to the desired throughput of the system. As shown for one embodiment in FIGS. 2 and 3, the loading station 210 includes two wafer cassette receiving areas 224, two loading station transfer robots 228 and one wafer orientor 230. A wafer cassette 232 containing wafers 234 is loaded onto the wafer cassette receiving area 224 to introduce wafers 234 into the electroplating system platform. The loading station transfer robot 228 transfers wafers 234 between the wafer cassette 232 and the wafer orientor 230. The loading station transfer robot 228 comprises a typical transfer robot commonly known in the art. The wafer orientor 230 positions each wafer 234 in a desired orientation to ensure that the wafer is properly processed. The loading station transfer robot 228 also transfers wafers 234 between the loading station 210 and the SRD station 212 and between the loading station 210 and the thermal anneal chamber 211.

FIG. 4 is a schematic perspective view of a spin-rinse-dry (SRD) module of the present invention, incorporating rinsing and dissolving fluid inlets. FIG. 5 is a side cross sectional view of the spin-rinse-dry (SRD) module of FIG. 4 and shows a substrate in a processing position vertically disposed between fluid inlets. Preferably, the SRD station 212 includes one or more SRD modules 236 and one or more wafer pass-through cassettes 238. Preferably, the SRD station 212 includes two SRD modules 236 corresponding to the number of loading station transfer robots 228, and a wafer pass-through cassette 238 is positioned above each SRD module 236. The wafer pass-through cassette 238 facilitates wafer transfer between the loading station 210 and the mainframe 214. The wafer pass-through cassette 238 provides access to and from both the loading station transfer robot 228 and a robot in the mainframe transfer station 216.

Referring to FIGS. 4 and 5, the SRD module 238 comprises a bottom 330a and a sidewall 330b, and an upper shield 330c which collectively define a SRD module bowl 330d, where the shield attaches to the sidewall and assists in retaining the fluids within the SRD module. Alternatively, a removable cover could also be used. A pedestal 336, located in the SRD module, includes a pedestal support 332 and a pedestal actuator 334. The pedestal 336 supports the substrate 338 (shown in FIG. 5) on the pedestal upper surface during processing. The pedestal actuator 334 rotates the pedestal to spin the substrate and raises and lowers the pedestal as described below. The substrate may be held in place on the pedestal by a plurality of clamps 337. The clamps pivot with centrifugal force and engage the substrate preferably in the edge exclusion zone of the substrate. In a preferred embodiment, the clamps engage the substrate only when the substrate lifts off the pedestal during the processing. Vacuum passages (not shown) may also be used as well as other holding elements. The pedestal has a plurality of pedestal arms 336a and 336b, so that the fluid through the second nozzle may impact as much surface area on the lower surface of the substrate as is practical. An outlet 339 allows fluid to be removed from the SRD module. The terms "below", "above", "bottom", "top", "up", "down", "upper", and "lower" and other positional terms used herein are shown with respect to the embodiments in the figures and may be varied depending on the relative orientation of the processing apparatus.

A first conduit 346, through which a first fluid 347 flows, is connected to a valve 347a. The conduit may be hose, pipe, tube, or other fluid containing conduits. The valve 347a controls the flow of the first fluid 347 and may be selected from a variety of valves including a needle, globe, butterfly, or other valve types and may include a valve actuator, such as a solenoid, that can be controlled with a controller 362. The conduit 346 connects to a first fluid inlet 340 that is located above the substrate and includes a mounting portion 342 to attach to the SRD module and a connecting portion 344 to attach to the conduit 346. The first fluid inlet is shown with a single first nozzle 348 to deliver a first fluid 347 under pressure onto the substrate upper surface. However, multiple nozzles could be used and multiple fluid inlets could be positioned about the inner perimeter of the SRD module. Preferably, nozzles placed above the substrate should be outside the diameter of the substrate to lessen the risk of the nozzles dripping on the substrate. The first fluid inlet could be mounted in a variety of locations, including through a cover positioned above the substrate. Additionally, the nozzle may articulate to a variety of positions using an articulating member 343, such as a ball and socket joint.

Similar to the first conduit and related elements described above, a second conduit 352 is connected to a control valve 349a and a second fluid inlet 350 with a second nozzle 351. The second fluid inlet 350 is shown below the substrate and angled upward to direct a second fluid under the substrate through the second nozzle 351. Similar to the first fluid inlet, the second fluid inlet may include a plurality of nozzles, a plurality of fluid inlets and mounting locations, and a plurality of orientations including using the articulating member 353. Each fluid inlet could be extended into the SRD module at a variety of positions. For instance, if the flow is desired to be a certain angle that is directed back toward the SRD module periphery along the edge of the substrate, the nozzles could be extended radially inward and the discharge from the nozzles be directed back toward the SRD module periphery.

The controller 362 could individually control the two fluids and their respective flow rates, pressure, and timing, and any associated valving, as well as the spin cycle(s). The controller could be remotely located, for instance, in a control panel or control room and the plumbing controlled with remote actuators. An alternative embodiment, shown in dashed lines, provides an auxiliary fluid inlet 346a connected to the first conduit 346 with a conduit 346b and having a control valve 346c, which may be used to flow a rinsing fluid on the backside of the substrate after the dissolving fluid is flown without having to reorient the substrate or switch the flow through the second fluid inlet to a rinsing fluid.

In one embodiment, the substrate is mounted with the deposition surface of the disposed face up in the SRD module bowl. As will be explained below, for such an arrangement, the first fluid inlet would generally flow a rinsing fluid, typically deionized water or alcohol. Consequently, the backside of the substrate would be mounted facing down and a fluid flowing through the second fluid inlet would be a dissolving fluid, such as an acid, including hydrochloric acid, sulfuric acid, phosphoric acid, hydrofluoric acid, or other dissolving liquids or fluids, depending on the material to be dissolved. Alternatively, the first fluid and the second fluid are both rinsing fluids, such as deionized water or alcohol, when the desired process is to rinse the processed substrate.

In operation, the pedestal is in a raised position, shown in FIG. 4, and a robot (not shown) places the substrate, front side up, onto the pedestal. The pedestal lowers the substrate to a processing position where the substrate is vertically disposed between the first and the second fluid inlets. Generally, the pedestal actuator rotates the pedestal between about 5 to about 5000 rpm, with a typical range between about 20 to about 2000 rpm for a 200 mm substrate. The rotation causes the lower end 337a of the clamps to rotate outward about pivot 337b, toward the periphery of the SRD module sidewall, due to centrifugal force. The clamp rotation forces the upper end 337c of the clamp inward and downward to center and hold the substrate 338 in position on the pedestal 336, preferably along the substrate edge. The clamps may rotate into position without touching the substrate and hold the substrate in position on the pedestal only if the substrate significantly lifts off the pedestal during processing. With the pedestal rotating the substrate, a rinsing fluid is delivered onto the substrate front side through the first fluid inlet 340. The second fluid, such as an acid, is delivered to the backside surface through the second fluid inlet to remove any unwanted deposits. The dissolving fluid chemically reacts with the deposited material and dissolves and then flushes the material away from the substrate backside and other areas where any unwanted deposits are located. In a preferred embodiment, the rinsing fluid is adjusted to flow at a greater rate than the dissolving fluid to help protect the front side of the substrate from the dissolving fluid. The first and second fluid inlets are located for optimal performance depending on the size of the substrate, the respective flow rates, spray patterns, and amount and type of deposits to be removed, among other factors. In some instances, the rinsing fluid could be routed to the second fluid inlet after a dissolving fluid has dissolved the unwanted deposits to rinse the backside of the substrate. In other instances, an auxiliary fluid inlet connected to flow rinsing fluid on the backside of the substrate could be used to rinse any dissolving fluid residue from the backside. After rinsing the front side and/or backside of the substrate, the fluid(s) flow is stopped and the pedestal continues to rotate, spinning the substrate, and thereby effectively drying the surface.

The fluid(s) is generally delivered in a spray pattern, which may be varied depending on the particular nozzle spray pattern desired and may include a fan, jet, conical, and other patterns. One spray pattern for the first and second fluids through the respective fluid inlets, when the first fluid is a rinsing fluid, is fan pattern with a pressure of about 10 to about 15 pounds per square inch (psi) and a flow rate of about 1 to about 3 gallons per minute (gpm) for a 200 mm wafer.

The invention could also be used to remove the unwanted deposits along the edge of the substrate to create an edge exclusion zone. By adjustment of the orientation and placement of the nozzles, the flow rates of the fluids, the rotational speed of the substrate, and the chemical composition of the fluids, the unwanted deposits could be removed from the edge and/or edge exclusion zone of the substrate as well. Thus, substantially preventing dissolution of the deposited material on the front side surface may not necessarily include the edge or edge exclusion zone of the substrate. Also, preventing dissolution of the deposited material on the front side surface is intended to include at least preventing the dissolution so that the front side with the deposited material is not impaired beyond a commercial value.

One method of accomplishing the edge exclusion zone dissolution process is to rotate the disk at a slower speed, such as about 100 to about 1000 rpm, while dispensing the dissolving fluid on the backside of the substrate. The centrifugal force moves the dissolving fluid to the edge of the substrate and forms a layer of fluid around the edge due to surface tension of the fluid, so that the dissolving fluid overlaps from the backside to the front side in the edge area of the substrate. The rotational speed of the substrate and the flow rate of the dissolving fluid may be used to determine the extent of the overlap onto the front side. For instance, a decrease in rotational speed or an increase in flow results in a less overlap of fluid to the opposing side, e.g., the front side. Additionally, the flow rate and flow angle of the rinsing fluid delivered to the front side can be adjusted to offset the layer of dissolving fluid onto the edge and/or frontside of the substrate. In some instances, the dissolving fluid may be used initially without the rinsing fluid to obtain the edge and/or edge exclusion zone removal, followed by the rinsing/dissolving process of the present invention described above.

The SRD module 238 is connected between the loading station 210 and the mainframe 214. The mainframe 214 generally comprises a mainframe transfer station 216 and a plurality of processing stations 218. Referring to FIGS. 2 and 3, the mainframe 214, as shown, includes two processing stations 218, each processing station 218 having two processing cells 240. The mainframe transfer station 216 includes a mainframe transfer robot 242. Preferably, the mainframe transfer robot 242 comprises a plurality of individual robot arms 244 that provides independent access of wafers in the processing stations 218 and the SRD stations 212. As shown in FIG. 3, the mainframe transfer robot 242 comprises two robot arms 244, corresponding to the number of processing cells 240 per processing station 218. Each robot arm 244 includes a robot blade 246 for holding a wafer during a wafer transfer. Preferably, each robot arm 244 is operable independently of the other arm to facilitate independent transfers of wafers in the system. Alternatively, the robot arms 244 operate in a linked fashion such that one robot extends as the other robot arm retracts.

Preferably, the mainframe transfer station 216 includes a flipper robot 248 that facilitates transfer of a wafer from a face-up position on the robot blade 246 of the mainframe transfer robot 242 to a face down position for a process cell 240 that requires face-down processing of wafers. The flipper robot 248 includes a main body 250 that provides both vertical and rotational movements with respect to a vertical axis of the main body 250 and a flipper robot arm 252 that provides rotational movement along a horizontal axis along the flipper robot arm 252. Preferably, a vacuum suction gripper 254, disposed at the distal end of the flipper robot arm 252, holds the wafer as the wafer is flipped and transferred by the flipper robot 248. The flipper robot 248 positions a wafer 234 into the processing cell 240 for face-down processing. The details of the electroplating processing cell according to the invention will be discussed below.

FIG. 24 is a top schematic view of a mainframe transfer robot having a flipper robot incorporated therein. The mainframe transfer robot 216' as shown in FIG. 24 serves to transfer wafers between different stations attached the mainframe station, including the processing stations and the SRD stations. The mainframe transfer robot 216' includes a plurality of robot arms 2402 (two shown), and a flipper robot 2404 is attached as an end effector for each of the robot arms 2402. Flipper robots are generally known in the art and can be attached as end effectors for wafer handling robots, such as model RR701, available from Rorze Automation, Inc., located in Milpitas, Calif. The main transfer robot 216' having a flipper robot as the end effector is capable of transferring substrates between different stations attached to the mainframe as well as flipping the substrate being transferred to the desired surface orientation, i.e., substrate processing surface being face-down for the electroplating process. Preferably, the mainframe transfer robot 216' provides independent robot motion along the X-Y-Z axes by the robot arm 2402 and independent substrate flipping rotation by the flipper robot end effector 2404. By incorporating the flipper robot 2404 as the end effector of the mainframe transfer robot, the wafer transfer process is simplified because the step of passing a wafer from a mainframe transfer robot to a flipper robot is eliminated.

FIG. 6 is a cross sectional view of an electroplating process cell 400 according to the invention. The electroplating process cell 400 as shown in FIG. 6 is the same as the electroplating process cell 240 as shown in FIGS. 2 and 3. The processing cell 400 generally comprises a head assembly 410, a process kit 420 and an electrolyte collector 440. Preferably, the electrolyte collector 440 is secured onto the body 442 of the mainframe 214 over an opening 443 that defines the location for placement of the process kit 420. The electrolyte collector 440 includes an inner wall 446, an outer wall 448 and a bottom 447 connecting the walls. An electrolyte outlet 449 is disposed through the bottom 447 of the electrolyte collector 440 and connected to the electrolyte replenishing system 220 (shown in FIG. 2) through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process kit 420 to provide the spacing required to remove and/or replace the process kit 420 from the electroplating process cell 400. When the cantilever arm actuator 457 is extended, the cantilever arm 456 moves the head assembly 410 toward the process kit 420 to position the wafer in the head assembly 410 in a processing position.

The head assembly 410 generally comprises a wafer holder assembly 450 and a wafer assembly actuator 458. The wafer assembly actuator 458 is mounted onto the mounting plate 460, and includes a head assembly shaft 462 extending downwardly through the mounting plate 460. The lower end of the head assembly shaft 462 is connected to the wafer holder assembly 450 to position the wafer holder assembly 450 in a processing position and in a wafer loading position.

The wafer holder assembly 450 generally comprises a wafer holder 464 and a cathode contact ring 466. FIG. 7 is a cross sectional view of one embodiment of a cathode contact ring 466 of the present invention. In general, the contact ring 466 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

Referring now to FIG. 7 in detail, the contact ring 466 generally comprises a plurality of conducting members 765 at least partially disposed within an annular insulative body 770. The insulative body 770 is shown having a flange 762 and a downward sloping shoulder portion 764 leading to a substrate seating surface 768 located below the flange 762 such that the flange 762 and the substrate seating surface 768 lie in offset and substantially parallel planes. Thus, the flange 762 may be understood to define a first plane while the substrate seating surface 768 defines a second plane parallel to the first plane wherein the shoulder 764 is disposed between the two planes. However, contact ring design shown in FIG. 7 is intended to be merely illustrative. In another embodiment, the shoulder portion 764 may be of a steeper angle including a substantially vertical angle so as to be substantially normal to both the flange 762 and the substrate seating surface 768. Alternatively, the contact ring 466 may be substantially planar thereby eliminating the shoulder portion 764. However, for reasons described below, a preferred embodiment comprises the shoulder portion 764 shown in FIG. 6 or some variation thereof.

The conducting members 765 are defined by a plurality of outer electrical contact pads 780 annularly disposed on the flange 762, a plurality of inner electrical contact pads 772 disposed on a portion of the substrate seating surface 768, and a plurality of embedded conducting connectors 776 which link the pads 772, 780 to one another. The conducting members 765 are isolated from one another by the insulative body 770 which may be made of a plastic such as polyvinylidenefluoride (PVDF), perfluoroalkoxy resin (PFA), Teflon™, and Tefzel™, or any other insulating material such as Alumina ($Al_2O_3$) or other ceramics. The outer contact pads 780 are coupled to a power supply (not shown) to deliver current and voltage to the inner contact pads 772 via the connectors 776 during processing. In turn, the inner contact pads 772 supply the current and voltage to a substrate by maintaining contact around a peripheral portion of the substrate. Thus, in operation the conducting members 765 act as discrete current paths electrically connected to a substrate.

Low resistivity, and conversely high conductivity, are directly related to good plating. To ensure low resistivity, the conducting members 765 are preferably made of copper (Cu), platinum (Pt), tantalum (Ta), titanium (Ti), gold (Au), silver (Ag), stainless steel or other conducting materials. Low resistivity and low contact resistance may also be achieved by coating the conducting members 765 with a conducting material. Thus, the conducting members 765 may, for example, be made of copper (resistivity for copper is approximately $2 \times 10^{-8}$ Ω·m) and be coated with platinum (resistivity for platinum is approximately $10.6 \times 10^{-8}$ Ω·m). Coatings such as tantalum nitride (TaN), titanium nitride (TiN), rhodium (Rh), Au, Cu, or Ag on a conductive base materials such as stainless steel, molybdenum (Mo), Cu, and Ti are also possible. Further, since the contact pads 772, 780 are typically separate units bonded to the conducting connectors 776, the contact pads 772, 780 may comprise one material, such as Cu, and the conducting members 765 another, such as stainless steel. Either or both of the pads 772, 180 and conducting connectors 776 may be coated with a conducting material. Additionally, because plating repeatability may be adversely affected by oxidation which acts as an insulator, the inner contact pads 772 preferably comprise a material resistant to oxidation such as Pt, Ag, or Au.

In addition to being a function of the contact material, the total resistance of each circuit is dependent on the geometry, or shape, of the inner contact inner contact pads 772 and the force supplied by the contact ring 466. These factors define a constriction resistance, $R_{CR}$, at the interface of the inner contact pads 772 and the substrate seating surface 768 due to asperities between the two surfaces. Generally, as the applied force is increased the apparent area is also increased. The apparent area is, in turn, inversely related to $R_{CR}$ so that an increase in the apparent area results in a decreased $R_{CR}$. Thus, to minimize overall resistance it is preferable to maximize force. The maximum force applied in operation is limited by the yield strength of a substrate which may be damaged under excessive force and resulting pressure. However, because pressure is related to both force and area, the maximum sustainable force is also dependent on the geometry of the inner contact pads 772. Thus, while the contact pads 772 may have a flat upper surface as in FIG. 7, other shapes may be used to advantage. For example, two preferred shapes are shown in FIGS. 8 and 9. FIG. 8 shows a knife-edge contact pad and FIG. 9 shows a hemispherical contact pad. A person skilled in the art will readily recognize other shapes which may be used to advantage. A more complete discussion of the relation between contact geometry, force, and resistance is given in *Ney Contact Manual*, by Kenneth E. Pitney, The J. M. Ney Company, 1973, which is hereby incorporated by reference in its entirety.

The number of connectors 776 may be varied depending on the particular number of contact pads 772 (shown in FIG. 7) desired. For a 200 mm substrate, preferably at least twenty-four connectors 776 are spaced equally over 360°. However, as the number of connectors reaches a critical level, the compliance of the substrate relative to the contact ring 466 is adversely affected. Therefore, while more than twenty-four connectors 776 may be used, contact uniformity may eventually diminish depending on the topography of the contact pads 772 and the substrate stiffness. Similarly, while less than twenty-four connectors 776 may be used, current flow is increasingly restricted and localized, leading to poor plating results. Since the dimensions of the present invention are readily altered to suit a particular application (for example, a 300 mm substrate), the optimal number may easily be determined for varying scales and embodiments.

As shown in FIG. 10, the substrate seating surface 768 comprises an isolation gasket 782 disposed on the insulative body 770 and extending diametrically interior to the inner contact pads 772 to define the inner diameter of the contact ring 466. The isolation gasket 782 preferably extends slightly above the inner contact pads 772 (e.g., a few mils) and preferably comprises an elastomer such as Viton™, Teflon™, buna rubber and the like. Where the insulative body 770 also comprises an elastomer the isolation gasket 782 may be of the same material. In the latter embodiment, the isolation gasket 782 and the insulative body 770 may be monolithic, i.e., formed as a single piece. However, the isolation gasket 782 is preferably separate from the insulative body 770 so that it may be easily removed for replacement or cleaning.

While FIG. 10 shows a preferred embodiment of the isolation gasket 782 wherein the isolation gasket is seated entirely on the insulative body 770, FIGS. 8 and 9 show an alternative embodiment. In the latter embodiment, the insulative body 770 is partially machined away to expose the upper surface of the connecting member 776 and the isolation gasket 782 is disposed thereon. Thus, the isolation gasket 782 contacts a portion of the connecting member 776. This design requires less material to be used for the inner contact pads 772 which may be advantageous where material costs are significant such as when the inner contact pads 772 comprise gold.

Persons skilled in the art will recognize other embodiments which do not depart from the scope of the present invention.

During processing, the isolation gasket 782 maintains contact with a peripheral portion of the substrate plating surface and is compressed to provide a seal between the remaining cathode contact ring 466 and the substrate. The seal prevents the electrolyte from contacting the edge and backside of the substrate. As noted above, maintaining a clean contact surface is necessary to achieving high plating repeatability. Previous contact ring designs did not provide consistent plating results because contact surface topography varied over time. The contact ring of the present invention eliminates, or substantially minimizes, deposits which would otherwise accumulate on the inner contact pads 772 and change their characteristics thereby producing highly repeatable, consistent, and uniform plating across the substrate plating surface.

FIG. 11 is a simplified schematic diagram representing a possible configuration of the electrical circuit for the contact ring 466. To provide a uniform current distribution between the conducting members 765, an external resistor 700 is connected in series with each of the conducting members 765. Preferably, the resistance value of the external resistor 700 (represented as $R_{EXT}$) is much greater than the resistance of any other component of the circuit. As shown in FIG. 11, the electrical circuit through each conducting member 765 is represented by the resistance of each of the components connected in series with the power supply 702. $R_E$ represents the resistance of the electrolyte, which is typically dependent on the distance between the anode and the cathode contact ring and the composition of the electrolyte chemistry. Thus, $R_A$ represents the resistance of the electrolyte adjacent the substrate plating surface 754. $R_S$ represents the resistance of the substrate plating surface 754, and $R_C$ represents the resistance of the cathode conducting members 765 plus the constriction resistance resulting at the interface between the inner contact pads 772 and the substrate plating layer 754. Generally, the resistance value of the external resistor ($R_{EXT}$) is at least as much as $\Sigma R$ (where $\Sigma R$ equals the sum of $R_E$, $R_A$, $R_S$ and $R_C$). Preferably, the resistance value of the external resistor ($R_{EXT}$) is much greater than $\Sigma R$ such that $\Sigma R$ is negligible and the resistance of each series circuit approximates $R_{EXT}$.

Typically, one power supply is connected to all of the outer contact pads 780 of the cathode contact ring 466, resulting in parallel circuits through the inner contact pads 772. However, as the inner contact pad-to-substrate interface resistance varies with each inner contact pad 772, more current will flow, and thus more plating will occur, at the site of lowest resistance. However, by placing an external resistor in series with each conducting member 765, the value or quantity of electrical current passed through each conducting member 765 becomes controlled mainly by the value of the external resistor. As a result, the variations in the electrical properties between each of the inner contact pads 772 do not affect the current distribution on the substrate, and a uniform current density results across the plating surface which contributes to a uniform plating thickness. The external resistors also provide a uniform current distribution between different substrates of a process-sequence.

Although the contact ring 466 of the present invention is designed to resist deposit buildup on the inner contact pads 772, over multiple substrate plating cycles the substrate-pad interface resistance may increase, eventually reaching an unacceptable value. An electronic sensor/alarm 704 can be connected across the external resistor 700 to monitor the voltage/current across the external resistor to address this problem. If the voltage/current across the external resistor 700 falls outside of a preset operating range that is indicative of a high substrate-pad resistance, the sensor/alarm 704 triggers corrective measures such as shutting down the plating process until the problems are corrected by an operator. Alternatively, a separate power supply can be connected to each conducting member 765 and can be separately controlled and monitored to provide a uniform current distribution across the substrate. A very smart system (VSS) may also be used to modulate the current flow. The VSS typically comprises a processing unit and any combination of devices known in the industry used to supply and/or control current such as variable resistors, separate power supplies, etc. As the physiochemical, and hence electrical, properties of the inner contact pads 772 change over time, the VSS processes and analyzes data feedback. The data is compared to pre-established setpoints and the VSS then makes appropriate current and voltage alterations to ensure uniform deposition.

FIG. 18 is a perspective view of an alternative embodiment of a cathode contact ring. The cathode contact ring 1800 as shown in FIG. 18 comprises a conductive metal or a metal alloy, such as stainless steel, copper, silver, gold, platinum, titanium, tantalum, and other conductive materials, or a combination of conductive materials, such as stainless steel coated with platinum. The cathode contact ring 1800 includes an upper mounting portion 1810 adapted for mounting the cathode contact ring onto the wafer holder assembly and a lower substrate receiving portion 1820 adapted for receiving a substrate therein. The substrate receiving portion 1820 includes an annular substrate seating surface 1822 having a plurality of contact pads or bumps 1824 disposed thereon and preferably evenly spaced apart. When a substrate is positioned on the substrate seating surface 1822, the contact pads 1824 physically contact a peripheral region of the substrate to provide electrical contact to the electroplating seed layer on the substrate deposition surface. Preferably, the contact pads 1824 are coated with a noble metal, such as platinum or gold, that is resistant to oxidation.

The exposed surfaces of the cathode contact ring, except the surfaces of the contact pads that come in contact with the substrate, are preferably treated to provide hydrophilic surfaces or coated with a material that exhibits hydrophilic properties. Hydrophilic materials and hydrophilic surface treatments are known in the art. One company providing a hydrophilic surface treatment is Millipore Corporation, located in Bedford, Mass. The hydrophilic surface significantly reduces beading of the electrolyte on the surfaces of the cathode contact ring and promotes smooth dripping of the electrolyte from the cathode contact ring after the cathode contact ring is removed from the electroplating bath or electrolyte. By providing hydrophilic surfaces on the cathode contact ring that facilitate run-off of the electrolyte, plating defects caused by residual electrolyte on the cathode contact ring are significantly reduced. The inventors also contemplate application of this hydrophilic treatment or coating in other embodiments of cathode contact rings to reduce residual electrolyte beading on the cathode contact ring and the plating defects on a subsequently processed substrate that may result therefrom.

Referring to FIGS. 12 and 12A, the wafer holder 464 is preferably positioned above the cathode contact ring 466 and comprises a bladder assembly 470 that provides pressure to the backside of a wafer and ensures electrical contact between the wafer plating surface and the cathode contact ring 466. The inflatable bladder assembly 470 is disposed on a wafer holder plate 832. A bladder 836 disposed on a lower surface of the wafer holder plate 832 is thus located opposite and adjacent to the contacts on the cathode contact ring 466 with the substrate 821 interposed therebetween. A fluid source 838 supplies a fluid, i.e., a gas or liquid, to the bladder 836 allowing the bladder 836 to be inflated to varying degrees.

Referring now to FIGS. 12, 12A, and 13, the details of the bladder assembly 470 will be discussed. The wafer holder plate 832 is shown as substantially disc-shaped having an annular recess 840 formed on a lower surface and a centrally disposed vacuum port 841. One or more inlets 842 are formed in the wafer holder plate 832 and lead into the relatively enlarged annular mounting channel 843 and the annular recess 840. Quick-disconnect hoses 844 couple the fluid source 838 to the inlets 842 to provide a fluid thereto. The vacuum port 841 is preferably attached to a vacuum/pressure pumping system 859 adapted to selectively supply a pressure or create a vacuum at a backside of the substrate 821. The pumping system 859, shown in FIG. 12, comprises a pump 845, a cross-over valve 847, and a vacuum ejector 849 (commonly known as a venturi). One vacuum ejector that may be used to advantage in the present invention is available from SMC Pneumatics, Inc., of Indianapolis, Ind. The pump 845 may be a commercially available compressed gas source and is coupled to one end of a hose 851, the other end of the hose 851 being coupled to the vacuum port 841. The hose 851 is split into a pressure line 853 and a vacuum line 855 having the vacuum ejector 849 disposed therein. Fluid flow is controlled by the cross-over valve 847 which selectively switches communication with the pump 845 between the pressure line 853 and the vacuum line 855. Preferably, the cross-over valve has an OFF setting whereby fluid is restricted from flowing in either direction through hose 851. A shut-off valve 861 disposed in hose 851 prevents fluid from flowing from pressure line 855 upstream through the vacuum ejector 849. The desired direction of fluid flow is indicated by arrows.

Persons skilled in the art will readily appreciate other arrangements which do not depart from the spirit and scope of the present invention. For example, where the fluid source 838 is a gas supply it may be coupled to hose 851 thereby eliminating the need for a separate compressed gas supply, i.e., pump 845. Further, a separate gas supply and vacuum pump may supply the backside pressure and vacuum conditions. While it is preferable to allow for both a backside pressure as well as a backside vacuum, a simplified embodiment may comprise a pump capable of supplying only a backside vacuum. However, as will be explained below, deposition uniformity may be improved where a backside pressure is provided during processing. Therefore, an arrangement such as the one described above including a vacuum ejector and a cross-over valve is preferred.

Referring now to FIGS. 12A and 14, a substantially circular ring-shaped manifold 846 is disposed in the annular recess 840. The manifold 846 comprises a mounting rail 852 disposed between an inner shoulder 848 and an outer shoulder 850. The mounting rail 852 is adapted to be at least partially inserted into the annular mounting channel 843. A plurality of fluid outlets 854 formed in the manifold 846 provide communication between the inlets 842 and the bladder 836. Seals 837, such as O-rings, are disposed in the annular manifold channel 843 in alignment with the inlet 842 and outlet 854 and secured by the wafer holder plate 832 to ensure an airtight seal. Conventional fasteners (not shown) such as screws may be used to secure the manifold 846 to the wafer holder plate 832 via cooperating threaded bores (not shown) formed in the manifold 846 and the wafer holder plate 832.

Referring now to FIG. 15, the bladder 836 is shown, in section, as an elongated substantially semi-tubular piece of material having annular lip seals 856, or nodules, at each edge. In FIG. 12A, the lip seals 856 are shown disposed on the inner shoulder 848 and the outer shoulder 850. A portion of the bladder 836 is compressed against the walls of the annular recess 840 by the manifold 846 which has a width slightly less (e.g. a few millimeters) than the annular recess 840. Thus, the manifold 846, the bladder 836, and the annular recess 840 cooperate to form a fluid-tight seal. To prevent fluid loss, the bladder 836 is preferably comprised of some fluid impervious material such as silicon rubber or any comparable elastomer which is chemically inert with respect to the electrolyte and exhibits reliable elasticity. Where needed a compliant covering 857 may be disposed over the bladder 836, as shown in FIG. 15, and secured by means of an adhesive or thermal bonding. The covering 857 preferably comprises an elastomer such as Viton™, buna rubber or the like, which may be reinforced by Kevlar™, for example. In one embodiment, the covering 857 and the bladder 836 comprise the same material. The covering 857 has particular application where the bladder 836 is liable to rupturing. Alternatively, the bladder 836 thickness may simply be increased during its manufacturing to reduce the likelihood of puncture. Preferably, the exposed surface of the bladder 836 (if uncovered) and the exposed surface of the covering 857 are coated or treated to provide a hydrophilic surface (as discussed above for the surfaces of the cathode contact ring) to promote dripping and removal of the residual electrolyte after the head assembly is lifted above the process cell.

The precise number of inlets 842 and outlets 854 may be varied according to the particular application without deviating from the present invention. For example, while FIG. 12 shows two inlets with corresponding outlets, an alternative embodiment could employ a single fluid inlet which supplies fluid to the bladder 836.

In operation, the substrate 821 is introduced into the container body 802 by securing it to the lower side of the wafer holder plate 832. This is accomplished by engaging the pumping system 159 to evacuate the space between the substrate 821 and the wafer holder plate 832 via port 841 thereby creating a vacuum condition. The bladder 836 is then inflated by supplying a fluid such as air or water from the fluid source 838 to the inlets 842. The fluid is delivered into the bladder 836 via the manifold outlets 854, thereby pressing the substrate 821 uniformly against the contacts of the cathode contact ring 466. The electroplating process is then carried out. An electrolyte is then pumped into the process kit 420 toward the substrate 821 to contact the exposed substrate plating surface 820. The power supply provides a negative bias to the substrate plating surface 820 via the cathode contact ring 466. As the electrolyte is flowed across the substrate plating surface 820, ions in the electrolytic solution are attracted to the surface 820 and deposit on the surface 820 to form the desired film.

Because of its flexibility, the bladder 836 deforms to accommodate the asperities of the substrate backside and contacts of the cathode contact ring 466 thereby mitigating misalignment with the conducting cathode contact ring 466. The compliant bladder 836 prevents the electrolyte from contaminating the backside of the substrate 821 by establishing a fluid tight seal at a perimeter portion of a backside of the substrate 821. Once inflated, a uniform pressure is delivered downward toward the cathode contact ring 466 to achieve substantially equal force at all points where the substrate 821 and cathode contact ring 466 interface. The force can be varied as a function of the pressure supplied by the fluid source 838. Further, the effectiveness of the bladder assembly 470 is not dependent on the configuration of the cathode contact ring 466. For example, while FIG. 12 shows a pin configuration having a plurality of discrete contact points, the cathode contact ring 466 may also be a continuous surface.

Because the force delivered to the substrate 821 by the bladder 836 is variable, adjustments can be made to the current flow supplied by the contact ring 466. As described above, an oxide layer may form on the cathode contact ring 466 and act to restrict current flow. However, increasing the pressure of the bladder 836 may counteract the current flow restriction due to oxidation. As the pressure is increased, the malleable oxide layer is compromised and superior contact between the cathode contact ring 466 and the substrate 821 results. The effectiveness of the bladder 836 in this capacity may be further improved by altering the geometry of the cathode contact ring 466. For example, a knife-edge geometry is likely to penetrate the oxide layer more easily than a dull rounded edge or flat edge.

Additionally, the fluid tight seal provided by the inflated bladder 836 allows the pump 845 to maintain a backside vacuum or pressure either selectively or continuously, before, during, and after processing. Generally, however, the pump 845 is run to maintain a vacuum only during the transfer of substrates to and from the electroplating process cell 400 because it has been found that the bladder 836 is capable of maintaining the backside vacuum condition during processing without continuous pumping. Thus, while inflating the bladder 836, as described above, the backside vacuum condition is simultaneously relieved by disengaging the pumping system 859, e.g., by selecting an OFF position on the crossover valve 847. Disengaging the pumping system 859 may be abrupt or comprise a gradual process whereby the vacuum condition is ramped down. Ramping allows for a controlled exchange between the inflating bladder 836 and the simultaneously decreasing backside vacuum condition. This exchange may be controlled manually or by computer.

As described above, continuous backside vacuum pumping while the bladder 836 is inflated is not needed and may actually cause the substrate 820 to buckle or warp leading to undesirable deposition results. It may, however, be desirable to provide a backside pressure to the substrate 820 in order to cause a "bowing" effect of the substrate to be processed. The inventors of the present invention have discovered that bowing results in superior deposition. Thus, pumping system 859 is capable of selectively providing a vacuum or pressure condition to the substrate backside. For a 200 mm wafer a backside pressure up to 5 psi is preferable to bow the substrate. Because substrates typically exhibit some measure of pliability, a backside pressure causes the substrate to bow or assume a convex shape relative to the upward flow of the electrolyte. The degree of bowing is variable according to the pressure supplied by pumping system 859.

Those skilled in the art will readily recognize other embodiments which are contemplated by the present invention. For example, while FIG. 12A shows a preferred bladder 836 having a surface area sufficient to cover a relatively small perimeter portion of the substrate backside at a diameter substantially equal to the cathode contact ring 466, the bladder assembly 470 may be geometrically varied. Thus, the bladder assembly may be constructed using more fluid impervious material to cover an increased surface area of the substrate 821.

FIG. 19 is a partial cross sectional view of an alternative embodiment of a wafer holder assembly. The alternative wafer holder assembly 1900 comprises a bladder assembly 470, as described above, having the inflatable bladder 836 attached to the back surface of an intermediary wafer holder plate 1910. Preferably, a portion of the inflatable bladder 836 is sealingly attached to the back surface 1912 of the intermediary wafer holder plate 1910 using an adhesive or other bonding material. The front surface 1914 of the intermediary wafer holder plate 1910 is adapted to receive a wafer or substrate 821 to be processed, and an elastomeric o-ring 1916 is disposed in an annular groove 1918 on the front surface 1914 of the intermediary wafer holder plate 1910 to contact a peripheral portion of the wafer back surface. The elastomeric o-ring 1916 provides a seal between the wafer back surface and the front surface of the intermediary wafer holder plate. Preferably, the intermediary wafer holder plate includes a plurality of bores or holes 1920 extending through the plate that are in fluid communication with the vacuum port 841 to facilitate securing the wafer on the wafer holder using a vacuum force applied to the backside of the wafer. According to this alternative embodiment of the wafer holder assembly, the inflatable bladder does not directly contact a wafer being processed, and thus the risk of cutting or damaging the inflatable bladder during wafer transfers is significantly reduced. The elastomeric O-ring 1916 is preferably coated or treated to provide a hydrophilic surface (as discussed above for the surfaces of the cathode contact ring) for contacting the wafer, and the elastomeric O-ring 1916 is replaced as needed to ensure proper contact and seal to the wafer.

FIG. 25 is an alternative embodiment of the process head assembly having a rotatable head assembly 2410. Preferably, a rotational actuator is disposed on the cantilevered arm and attached to the head assembly to rotate the head assembly during wafer processing. The rotatable head assembly 2410 is mounted onto a head assembly frame 2452. The alternative head assembly frame 2452 and the rotatable head assembly 2410 are mounted onto the mainframe similarly to the head assembly frame 452 and head assembly 410 as shown in FIG. 6 and described above. The head assembly frame 2452 includes a mounting post 2454, a post cover 2455, and a cantilever arm 2456. The mounting post 2454 is mounted onto the body of the mainframe 214, and the post cover 2455 covers a top portion of the mounting post 2454. Preferably, the mounting post 454 provides rotational movement (as indicated by arrow A1) with respect to a vertical axis along the mounting post to allow rotation of the head assembly frame 2452. The cantilever arm 2456 extends laterally from an upper portion of the mounting post 2454 and is pivotally connected to the post cover 2455 at the pivot joint 2459. The rotatable head assembly 2410 is attached to a mounting slide 2460 disposed at the distal end of the cantilever arm 2456. The mounting slide 2460 guides the vertical motion of the head assembly 2410. A head lift actuator 2458 is disposed on top of the mounting slide 2460 to provide vertical displacement of the head assembly 2410.

The lower end of the cantilever arm 2456 is connected to the shaft 2453 of a cantilever arm actuator 2457, such as a pneumatic cylinder or a lead-screw actuator, mounted on the mounting post 2454. The cantilever arm actuator 2457 provides pivotal movement (as indicated by arrow A2) of the cantilever arm 2456 with respect to the joint 2459 between the cantilever arm 2456 and the post cover 2454. When the cantilever arm actuator 2457 is retracted, the cantilever arm 2456 moves the head assembly 2410 away from the process kit 420 to provide the spacing required to remove and/or replace the process kit 420 from the electroplating process cell 240. When the cantilever arm actuator 2457 is extended, the cantilever arm 2456 moves the head assembly 2410 toward the process kit 420 to position the wafer in the head assembly 2410 in a processing position.

The rotatable head assembly 2410 includes a rotating actuator 2464 slideably connected to the mounting slide 2460. The shaft 2468 of the head lift actuator 2458 is inserted through a lift guide 2466 attached to the body of the rotating actuator 2464. Preferably, the shaft 2468 is a lead-screw type shaft that moves the lift guide (as indicated by arrows A3) between various vertical position. The rotating actuator 2464 is connected to the wafer holder assembly 2450 through the shaft 2470 and rotates the wafer holder assembly 2450 (as indicated by arrows A4). The wafer holder assembly 2450 includes a bladder assembly, such as the embodiments described above with respect to FIGS. 12-15 and 19, and a cathode contact ring, such as the embodiments described above with respect to FIGS. 7-10 and 18.

The rotation of the wafer during the electroplating process generally enhances the deposition results. Preferably, the head assembly is rotated between about 2 rpm and about 20 rpm during the electroplating process. The head assembly can also be rotated as the head assembly is lowered to position the wafer in contact with the electrolyte in the process cell as well as when the head assembly is raised to remove the wafer from the electrolyte in the process cell. The head assembly is preferably rotated at a high speed (i.e., >20 rpm) after the head assembly is lifted from the process cell to enhance removal of residual electrolyte on the head assembly.

In one embodiment, the inventors have improved the uniformity of the deposited film to within about 2% (i.e., maximum deviation of deposited film thickness is at about 2% of the average film thickness) while standard electroplating processes typically achieves uniformity at best within about 5.5%. However, rotation of the head assembly is not necessary to achieve uniform electroplating deposition in some instances, particularly where the uniformity of electroplating deposition is achieved by adjusting the processing parameters, such as the electrolyte chemistry, electrolyte flow and other parameters.

Referring back to FIG. 6, a cross sectional view of an electroplating process cell 400, the wafer holder assembly 450 is positioned above the process kit 420. The process kit 420 generally comprises a bowl 430, a container body 472, an anode assembly 474 and a filter 476. Preferably, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, plexiglass (acrylic), lexane, PVC, CPVC, and PVDF. Alternatively, the container body 472 can be made from a metal, such as stainless steel, nickel and titanium, which is coated with an insulating layer, such as Teflon™, PVDF, plastic, rubber and other combinations of materials that do not dissolve in the electrolyte and can be electrically insulated from the electrodes (i.e., the anode and cathode of the electroplating system). The container body 472 is preferably sized and adapted to conform to the wafer plating surface and the shape of the of a wafer being processed through the system, typically circular or rectangular in shape. One preferred embodiment of the container body 472 comprises a cylindrical ceramic tube having an inner diameter that has about the same dimension as or slightly larger than the wafer diameter. The inventors have discovered that the rotational movement typically required in typical electroplating systems is not required to achieve uniform plating results when the size of the container body conforms to about the size of the wafer plating surface.

An upper portion of the container body 472 extends radially outwardly to form an annular weir 478. The weir 478 extends over the inner wall 446 of the electrolyte collector 440 and allows the electrolyte to flow into the electrolyte collector 440. The upper surface of the weir 478 preferably matches the lower surface of the cathode contact ring 466.

Preferably, the upper surface of the weir 478 includes an inner annular flat portion 480, a middle inclined portion 482 and an outer declined portion 484. When a wafer is positioned in the processing position, the wafer plating surface is positioned above the cylindrical opening of the container body 472, and a gap for electrolyte flow is formed between the lower surface of the cathode contact ring 466 and the upper surface of the weir 478. The lower surface of the cathode contact ring 466 is disposed above the inner flat portion 480 and the middle inclined portion of the weir 478. The outer declined portion 484 is sloped downwardly to facilitate flow of the electrolyte into the electrolyte collector 440.

A lower portion of the container body 472 extends radially outwardly to form a lower annular flange 486 for securing the container body 472 to the bowl 430. The outer dimension (i.e., circumference) of the annular flange 486 is smaller than the dimensions of the opening 444 and the inner circumference of the electrolyte collector 440 to allow removal and replacement of the process kit 420 from the electroplating process cell 400. Preferably, a plurality of bolts 488 are fixedly disposed on the annular flange 486 and extend downwardly through matching bolt holes on the bowl 430. A plurality of removable fastener nuts 490 secure the process kit 420 onto the bowl 430. A seal 487, such as an elastomer O-ring, is disposed between container body 472 and the bowl 430 radially inwardly from the bolts 488 to prevent leaks from the process kit 420. The nuts/bolts combination facilitates fast and easy removal and replacement of the components of the process kit 420 during maintenance.

Preferably, the filter 476 is attached to and completely covers the lower opening of the container body 472, and the anode assembly 474 is disposed below the filter 476. A spacer 492 is disposed between the filter 476 and the anode assembly 474. Preferably, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430.

The anode assembly 474 preferably comprises a consumable anode that serves as a metal source in the electrolyte. Alternatively, the anode assembly 474 comprises a non-consumable anode, and the metal to be electroplated is supplied within the electrolyte from the electrolyte replenishing system 220. As shown in FIG. 6, the anode assembly 474 is a self-enclosed module having a porous anode enclosure 494 preferably made of the same metal as the metal to be electroplated, such as copper. Alternatively, the anode enclosure 494 is made of porous materials, such as ceramics or polymeric membranes. A soluble metal 496, such as high purity copper for electro-chemical deposition of copper, is disposed within the anode enclosure 494. The soluble metal 496 preferably comprises metal particles, wires or a perforated sheet. The porous anode enclosure 494 also acts as a filter that keeps the particulates generated by the dissolving metal within the anode enclosure 494. As compared to a non-consumable anode, the consumable (i.e., soluble) anode provides gas-generation-free electrolyte and minimizes the need to constantly replenish the metal in the electrolyte.

An anode electrode contact 498 is inserted through the anode enclosure 494 to provide electrical connection to the soluble metal 496 from a power supply. Preferably, the anode electrode contact 498 is made from a conductive material that is insoluble in the electrolyte, such as titanium, platinum and platinum-coated stainless steel. The anode electrode contact 498 extends through the bowl 430 and is connected to an electrical power supply. Preferably, the anode electrical contact 498 includes a threaded portion 497 for a fastener nut 499 to secure the anode electrical contact 498 to the bowl 430, and a seal 495, such as a elastomer washer, is disposed between the fastener nut 499 and the bowl 430 to prevent leaks from the process kit 420.

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. To secure the upper annular flange 506 of the bowl 430 and the lower annular flange 486 of the container body 472, the bolts 488 are inserted through the holes 508, and the fastener nuts 490 are fastened onto the bolts 488. Preferably, the outer dimension (i.e., circumference) of the upper annular flange 506 is about the same as the outer dimension (i.e., circumference) of the lower annular flange 486. Preferably, the lower surface of the upper annular flange 506 of the bowl 430 rests on a support flange of the mainframe 214 when the process kit 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502 to force a substantial portion of the electrolyte to flow through the anode assembly 474 first before flowing through the filter 476. The bottom portion 504 of the bowl 430 includes an electrolyte inlet 510 that connects to an electrolyte supply line from the electrolyte replenishing system 220. Preferably, the anode assembly 474 is disposed about a middle portion of the cylindrical portion 502 of the bowl 430 to provide a gap for electrolyte flow between the anode assembly 474 and the electrolyte inlet 510 on the bottom portion 504.

The electrolyte inlet 510 and the electrolyte supply line are preferably connected by a releasable connector that facilitates easy removal and replacement of the process kit 420. When the process kit 420 needs maintenance, the electrolyte is drained from the process kit 420, and the electrolyte flow in the electrolyte supply line is discontinued and drained. The connector for the electrolyte supply line is released from the electrolyte inlet 510, and the electrical connection to the anode assembly 474 is also disconnected. The head assembly 410 is raised or rotated to provide clearance for removal of the process kit 420. The process kit 420 is then removed from the mainframe 214, and a new or reconditioned process kit is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

FIG. 20 is a cross sectional view of a first embodiment of an encapsulated anode. The encapsulated anode 2000 includes a permeable anode enclosure that filters or traps "anode sludge" or particulates generated as the metal is dissolved from the anode plate 2004. As shown in FIG. 20, the consumable anode plate 2004 comprises a solid piece of copper, preferably, high purity, oxygen free copper, enclosed in a hydrophilic anode encapsulation membrane 2002. The anode plate 2004 is secured and supported by a plurality of electrical contacts or feed-throughs 2006 that extend through the bottom of the bowl 430. The electrical contacts or feed-throughs 2006 extend through the anode encapsulation membrane 2002 into the bottom surface of the anode plate 2004. The flow of the electrolyte is indicated by the arrows A from the electrolyte inlet 510 disposed at the the bottom of the bowl 430 through the gap between the anode and the bowl sidewall. The electrolyte also flows through the anode encapsulation membrane 2002 by permeation into and out of the gap between the anode encapsulation membrane and the anode plate, as indicated by the arrows B. Preferably, the anode encapsulation membrane 2002 comprises a hydrophilic porous membrane, such as a modified polyvinyllidene fluoride membrane, having porosity between about 60% and 80%, more preferably about 70%, and pore sizes between about 0.025 μm and about 1 μm, more preferably between about 0.1 μm and about 0.2 μm. One example of a hydrophilic porous membrane is the Durapore Hydrophilic Membrane, available from Millipore Corporation, located in Bedford, Mass. As the electrolyte flows through the encapsulation membrane, anode sludge and particulates generated by the dissolving anode are filtered or trapped by the encapsulation membrane. Thus, the encapsulation membranes improve the purity of the electrolyte during the electroplating process, and defect formations on the substrate during the electroplating process caused by anode sludge and contaminant particulates are significantly reduced.

FIG. 21 is a cross sectional view of a second embodiment of an encapsulated anode. Similar to the first embodiment of an encapsulated anode, the anode plate 2004 is secured and supported on the electrical feed-throughs 2006. A top encapsulation membrane 2008 and a bottom encapsulation membrane 2010, disposed respectively above and below the anode plate 2004, are attached to a membrane support ring 2012 that is disposed around the anode plate 2004. The top and bottom encapsulation membranes 2008, 2010 comprise a material from the list above for encapsulation membrane of the first embodiment of the encapsulated anode. The membrane support ring 2012 preferably comprises a relatively rigid material (as compared to the encapsulation membrane), such as plastic or other polymers. A bypass fluid inlet 2014 is disposed through the bottom of the bowl 430 and through the bottom encapsulation membrane 2010 to introduce electrolyte into the gap between the encapsulation membranes and the anode plate. A bypass outlet 2016 is connected to the membrane support ring 2012 and extends through the bowl 430 to facilitate flow of excess electrolyte with the anode sludge or generated particulates out of the encapsulated anode into a waste drain (not shown).

Preferably, the flow of the electrolyte within the bypass fluid inlet 2014 and the main electrolyte inlet 510 are individually controlled by flow control valves 2020, 2022, respectively placed along the fluid lines connected to the inlets, and the fluid pressure in the bypass fluid inlet 2014 is preferably maintained at a higher pressure than the pressure in the main electrolyte inlet 510. The flow of the electrolyte inside the bowl 430 from the main electrolyte inlet 510 is indicated by arrows A, and the flow of the electrolyte inside the encapsulated anode 2000 is indicated by the arrows B. A portion of the electrolyte introduced into the encapsulated anode flows out of the encapsulated anode through the bypass outlet 2016. By providing a dedicated bypass electrolyte supply into the encapsulated anode, the anode sludge or particulates generated from the dissolving consumable anode is continually removed from the anode, thereby improving the purity of the electrolyte during the electroplating process.

FIG. 22 is a cross sectional view of a third embodiment of an encapsulated anode. The third embodiment of an encapsulated anode 2000 includes an anode plate 2004 secured and supported on a plurality of electrical feed-throughs 2006, a top and a bottom encapsulation membrane 2008, 2010 attached to a membrane support ring 2012, and a bypass outlet 2016 connected to the membrane support ring 2012 and extending through the bowl 430. This third embodiment of an encapsulated anode preferably comprises materials as described above for the first and second embodiments of an encapsulated anode. The bottom encapsulation membrane 2010 according to the third embodiment includes one or more openings 2024 disposed substantially above the main electrolyte inlet 510. The opening 2024 is adapted to receive flow of electrolyte from the main electrolyte inlet 510 and is preferably about the same size as the internal circumference of the main electrolyte inlet 510. The flow of the electrolyte from the main electrolyte inlet 510 is indicated by the arrows A and the flow of the electrolyte within the encapsulated anode is indicated by the arrows B. A portion of the electrolyte flows out of the encapsulated anode through the bypass outlet 2016, carrying a portion of the anode sludge and particulates generated from anode dissolution.

FIG. 23 is a cross sectional view of a fourth embodiment of an encapsulated anode. The fourth embodiment of an encapsulated anode 2000 includes an anode plate 2002 secured and supported on a plurality of electrical feed-throughs 2006, a top and a bottom encapsulation membrane 2008, 2010 attached to a membrane support ring 2012, and a bypass fluid inlet 2014 disposed through the bottom of the bowl 430 and through the bottom encapsulation membrane 2010 to introduce electrolyte into the gap between the encapsulation membranes and the anode plate. This fourth embodiment of an encapsulated anode preferably comprises materials as described above for the first and second embodiments of an encapsulated anode. Preferably, the flow of the electrolyte through the bypass fluid inlet 2014 and the main electrolyte inlet 510 are individually controlled by control valves 2020, 2022, respectively. The flow of the electrolyte from the main electrolyte inlet 510 is indicated by the arrows A while the flow of the electrolyte through the encapsulated anode is indicated by arrows B. For this embodiment, the anode sludge and particulates generated by the dissolving anode plate are filtered and trapped by the encapsulation membranes as the electrolyte passes through the membrane.

FIG. 16 is a schematic diagram of an electrolyte replenishing system 220. The electrolyte replenishing system 220 provides the electrolyte to the electroplating process cells for the electroplating process. The electrolyte replenishing system 220 generally comprises a main electrolyte tank 602, a dosing module 603, a filtration module 605, a chemical analyzer module 616, and an electrolyte waste disposal system 622 connected to the analyzing module 616 by an electrolyte waste drain 620. One or more controllers control the composition of the electrolyte in the main tank 602 and the operation of the electrolyte replenishing system 220. Preferably, the controllers are independently operable but integrated with the control system 222 of the electroplating system platform 200.

The main electrolyte tank 602 provides a reservoir for electrolyte and includes an electrolyte supply line 612 that is connected to each of the electroplating process cells through one or more fluid pumps 608 and valves 607. A heat exchanger 624 or a heater/chiller disposed in thermal connection with the main tank 602 controls the temperature of the electrolyte stored in the main tank 602. The heat exchanger 624 is connected to and operated by the controller 610.

The dosing module 603 is connected to the main tank 602 by a supply line and includes a plurality of source tanks 606, or feed bottles, a plurality of valves 609, and a controller 611.

The source tanks 606 contain the chemicals needed for composing the electrolyte and typically include a deionized water source tank and copper sulfate ($CuSO_4$) source tank for composing the electrolyte. Other source tanks 606 may contain hydrogen sulfate ($H_2SO_4$), hydrogen chloride (HCl) and various additives such as glycol. Each source tank is preferably color coded and fitted with a unique mating outlet connector adapted to connect to a matching inlet connector in the dosing module. By color coding the source tanks and fitting the source tanks with unique connectors, errors caused by human operators when exchanging or replacing the source tanks are significantly reduced.

The deionized water source tank preferably also provides deionized water to the system for cleaning the system during maintenance. The valves 609 associated with each source tank 606 regulate the flow of chemicals to the main tank 602 and may be any of numerous commercially available valves such as butterfly valves, throttle valves and the like. Activation of the valves 609 is accomplished by the controller 611 which is preferably connected to the system control 222 to receive signals therefrom.

The electrolyte filtration module 605 includes a plurality of filter tanks 604. An electrolyte return line 614 is connected between each of the process cells and one or more filter tanks 604. The filter tanks 604 remove the undesired contents in the used electrolyte before returning the electrolyte to the main tank 602 for re-use. The main tank 602 is also connected to the filter tanks 604 to facilitate re-circulation and filtration of the electrolyte in the main tank 602. By re-circulating the electrolyte from the main tank 602 through the filter tanks 604, the undesired contents in the electrolyte are continuously removed by the filter tanks 604 to maintain a consistent level of purity. Additionally, re-circulating the electrolyte between the main tank 602 and the filtration module 605 allows the various chemicals in the electrolyte to be thoroughly mixed.

The electrolyte replenishing system 220 also includes a chemical analyzer module 616 that provides real-time chemical analysis of the chemical composition of the electrolyte. The analyzer module 616 is fluidly coupled to the main tank 602 by a sample line 613 and to the waste disposal system 622 by an outlet line 621. The analyzer module 616 generally comprises at least one analyzer and a controller to operate the analyzer. The number of analyzers required for a particular processing tool depends on the composition of the electrolyte. For example, while a first analyzer may be used to monitor the concentrations of organic substances, a second analyzer is needed for inorganic chemicals. In the specific embodiment shown in FIG. 16 the chemical analyzer module 616 comprises an auto titration analyzer 615 and a cyclic voltametric stripper (CVS) 617. Both analyzers are commercially available from various suppliers. An auto titration analyzer which may be used to advantage is available from Parker Systems and a cyclic voltametric stripper is available from ECI. The auto titration analyzer 615 determines the concentrations of inorganic substances such as copper chloride and acid. The CVS 617 determines the concentrations of organic substances such as the various additives which may be used in the electrolyte and by-products resulting from the processing which are returned to the main tank 602 from the process cells.

The analyzer module shown FIG. 16 is merely illustrative. In another embodiment each analyzer may be coupled to the main electrolyte tank by a separate supply line and be operated by separate controllers. Persons skilled in the art will recognize other embodiments.

In operation, a sample of electrolyte is flowed to the analyzer module 616 via the sample line 613. Although the sample may be taken periodically, preferably a continuous flow of electrolyte is maintained to the analyzer module 616. A portion of the sample is delivered to the auto titration analyzer 615 and a portion is delivered to the CVS 617 for the appropriate analysis. The controller 619 initiates command signals to operate the analyzers 615, 617 in order to generate data. The information from the chemical analyzers 615, 617 is then communicated to the control system 222. The control system 222 processes the information and transmits signals which include user-defined chemical dosage parameters to the dosing controller 611. The received information is used to provide real-time adjustments to the source chemical replenishment rates by operating one or more of the valves 609 thereby maintaining a desired, and preferably constant, chemical composition of the electrolyte throughout the electroplating process. The waste electrolyte from the analyzer module is then flowed to the waste disposal system 622 via the outlet line 621.

Although a preferred embodiment utilizes real-time monitoring and adjustments of the electrolyte, various alternatives may be employed according to the present invention. For example, the dosing module 603 may be controlled manually by an operator observing the output values provided by the chemical analyzer module 616. Preferably, the system software allows for both an automatic real-time adjustment mode as well as an operator (manual) mode. Further, although multiple controllers are shown in FIG. 16, a single controller may be used to operate various components of the system such as the chemical analyzer module 616, the dosing module 603, and the heat exchanger 624. Other embodiments will be apparent to those skilled in the art.

The electrolyte replenishing system 220 also includes an electrolyte waste drain 620 connected to an electrolyte waste disposal system 622 for safe disposal of used electrolytes, chemicals and other fluids used in the electroplating system. Preferably, the electroplating cells include a direct line connection to the electrolyte waste drain 620 or the electrolyte waste disposal system 622 to drain the electroplating cells without returning the electrolyte through the electrolyte replenishing system 220. The electrolyte replenishing system 220 preferably also includes a bleed off connection to bleed off excess electrolyte to the electrolyte waste drain 620.

Preferably, the electrolyte replenishing system 220 also includes one or more degasser modules 630 adapted to remove undesirable gases from the electrolyte. The degasser module generally comprises a membrane that separates gases from the fluid passing through the degasser module and a vacuum system for removing the released gases. The degasser modules 630 are preferably placed in line on the electrolyte supply line 612 adjacent to the process cells 240. The degasser modules 630 are preferably positioned as close as possible to the process cells 240 so that most of the gases from the electrolyte replenishing system are removed by the degasser modules before the electrolyte enters the process cells. Preferably, each degasser module 630 includes two outlets to supply degassed electrolyte to the two process cells 240 of each processing station 218. Alternatively, a degasser module 630 is provided for each process cell. The degasser modules can be placed at many other alternative positions. For example, the degasser module can be placed at other positions in the electrolyte replenishing system, such as along with the filter section or in a closed-loop system with the main tank or with the processing cell. As another example, one degasser module is placed in line with the electrolyte supply line 612 to provide degassed electrolyte to all of the process cells 240 of the electro-chemical deposition system. Additionally, a separate degasser module is positioned in-line or in a closed-loop with the deionized water supply line and is dedicated for removing oxygen from the deionized water source. Because deionized water is used to rinse the processed substrates, free oxygen gases are preferable removed from the deionized water before reaching the SRD modules so that the electroplated copper is less likely to become oxidized by the rinsing process. Degasser modules are well known in the art and commercial embodiments are generally available and adaptable for use in a variety of applications. A commercially available degasser module is available from Millipore Corporation, located in Bedford, Mass.

One embodiment of the degasser module 630, as shown in FIG. 26a, includes a hydrophobic membrane 632 having a fluid (i.e., electrolyte) passage 634 on one side of the membrane 632 and a vacuum system 636 disposed on the opposite side of the membrane. The enclosure 638 of the degasser module includes an inlet 640 and one or more outlets 642. As the electrolyte passes through the degasser module 630, the gases and other micro-bubbles in the electrolyte are separated from the electrolyte through the hydrophobic membrane and removed by the vacuum system. Another embodiment of the degasser module 630', as shown in FIG. 26b, includes a tube of hydrophobic membrane 632' and a vacuum system 636 disposed around the tube of hydrophobic membrane 632'. The electrolyte is introduced inside the tube of hydrophobic membrane, and as the electrolyte passes through the fluid passage 634 in the tube, gases and other micro-bubbles in the electrolyte are separated from the electrolyte through the tube of hydrophobic membrane 632' and removed by the vacuum system 636 surrounding the tube. More complex designs of degasser modules are contemplated by the invention, including designs having serpentine paths of the electrolyte across the membrane and other multi-sectioned designs of degasser modules.

Although not shown in FIG. 16, the electrolyte replenishing system 220 may include a number of other components. For example, the electrolyte replenishing system 220 preferably also includes one or more additional tanks for storage of chemicals for a wafer cleaning system, such as the SRD station. Double-contained piping for hazardous material connections may also be employed to provide safe transport of the chemicals throughout the system. Optionally, the electrolyte replenishing system 220 includes connections to additional or external electrolyte processing system to provide additional electrolyte supplies to the electroplating system.

FIG. 17 is a cross sectional view of a rapid thermal anneal chamber according to the invention. The rapid thermal anneal (RTA) chamber 211 is preferably connected to the loading station 210, and substrates are transferred into and out of the RTA chamber 211 by the loading station transfer robot 228. The electroplating system, as shown in FIGS. 2 and 3, preferably comprises two RTA chambers 211 disposed on opposing sides of the loading station 210, corresponding to the symmetric design of the loading station 210. Thermal anneal process chambers are generally well known in the art, and rapid thermal anneal chambers are typically utilized in substrate processing systems to enhance the properties of the deposited materials. The invention contemplates utilizing a variety of thermal anneal chamber designs, including hot plate designs and heat lamp designs, to enhance the electroplating results. One particular thermal anneal chamber useful for the present invention is the WxZ chamber available from Applied materials, Inc., located in Santa Clara, Calif. Although the invention is described using a hot plate rapid thermal anneal chamber, the invention contemplates application of other thermal anneal chambers as well.

The RTA chamber 211 generally comprises an enclosure 902, a heater plate 904, a heater 907 and a plurality of substrate support pins 906. The enclosure 902 includes a base 908, a sidewall 910 and a top 912. Preferably, a cold plate 913 is disposed below the top 912 of the enclosure. Alternatively, the cold plate is integrally formed as part of the top 912 of the enclosure. Preferably, a reflector insulator dish 914 is disposed inside the enclosure 902 on the base 908. The reflector insulator dish 914 is typically made from a material such as quartz, alumina, or other material that can withstand high temperatures (i.e., greater than about 500° C.), and act as a thermal insulator between the heater 907 and the enclosure 902. The dish 914 may also be coated with a reflective material, such as gold, to direct heat back to the heater plate 906.

The heater plate 904 preferably has a large mass compared to the substrate being processed in the system and is preferably fabricated from a material such as silicon carbide, quartz, or other materials that do not react with any ambient gases in the RTA chamber 211 or with the substrate material. The heater 907 typically comprises a resistive heating element or a conductive/radiant heat source and is disposed between the heated plate 906 and the reflector insulator dish 914. The heater 907 is connected to a power source 916 which supplies the energy needed to heat the heater 907. Preferably, a thermocouple 920 is disposed in a conduit 922, disposed through the base 908 and dish 914, and extends into the heater plate 904. The thermocouple 920 is connected to a controller (i.e., the system controller described below) and supplies temperature measurements to the controller. The controller then increases or decreases the heat supplied by the heater 907 according to the temperature measurements and the desired anneal temperature.

The enclosure 902 preferably includes a cooling member 918 disposed outside of the enclosure 902 in thermal contact with the sidewall 910 to cool the enclosure 902. Alternatively, one or more cooling channels (not shown) are formed within the sidewall 910 to control the temperature of the enclosure 902. The cold plate 913 disposed on the inside surface of the top 912 cools a substrate that is positioned in close proximity to the cold plate 913.

The RTA chamber 211 includes a slit valve 922 disposed on the sidewall 910 of the enclosure 902 for facilitating transfers of substrates into and out of the RTA chamber. The slit valve 922 selectively seals an opening 924 on the sidewall 910 of the enclosure that communicates with the loading station 210. The loading station transfer robot 228 (see FIG. 2) transfers substrates into and out of the RTA chamber through the opening 924.

The substrate support pins 906 preferably comprise distally tapered members constructed from quartz, aluminum oxide, silicon carbide, or other high temperature resistant materials. Each substrate support pin 906 is disposed within a tubular conduit 926, preferably made of a heat and oxidation resistant material, that extends through the heater plate 904. The substrate support pins 906 are connected to a lift plate 928 for moving the substrate support pins 906 in a uniform manner. The lift plate 928 is attached to an to an actuator 930, such as a stepper motor, through a lift shaft 932 that moves the lift plate 928 to facilitate positioning of a substrate at various vertical positions within the RTA chamber. The lift shaft 932 extends through the base 908 of the enclosure 902 and is sealed by a sealing flange 934 disposed around the shaft.

To transfer a substrate into the RTA chamber 211, the slit valve 922 is opened, and the loading station transfer robot 228 extends its robot blade having a substrate positioned thereon through the opening 924 into the RTA chamber. The robot blade of the loading station transfer robot 228 positions the substrate in the RTA chamber above the heater plate 904, and the substrate support pins 906 are extended upwards to lift the substrate above the robot blade. The robot blade then retracts out of the RTA chamber, and the slit valve 922 closes the opening. The substrate support pins 906 are then retracted to lower the substrate to a desired distance from the heater plate 904. Optionally, the substrate support pins 906 may retract fully to place the substrate in direct contact with the heater plate.

Preferably, a gas inlet 936 is disposed through the sidewall 910 of the enclosure 902 to allow selected gas flow into the RTA chamber 211 during the anneal treatment process. The gas inlet 936 is connected to a gas source 938 through a valve 940 for controlling the flow of the gas into the RTA chamber 211. A gas outlet 942 is preferably disposed at a lower portion of the sidewall 910 of the enclosure 902 to exhaust the gases in the RTA chamber and is preferably connected to a relief/check valve 944 to prevent backstreaming of atmosphere from outside of the chamber. Optionally, the gas outlet 942 is connected to a vacuum pump (not shown) to exhaust the RTA chamber to a desired vacuum level during an anneal treatment.

According to the invention, a substrate is annealed in the RTA chamber 211 after the substrate has been electroplated in the electroplating cell and cleaned in the SRD station. Preferably, the RTA chamber 211 is maintained at about atmospheric pressure, and the oxygen content inside the RTA chamber 211 is controlled to less than about 100 ppm during the anneal treatment process. Preferably, the ambient environment inside the RTA chamber 211 comprises nitrogen ($N_2$) or a combination of nitrogen ($N_2$) and less than about 4% hydrogen ($H_2$), and the ambient gas flow into the RTA chamber 211 is maintained at greater than 20 liters/min to control the oxygen content to less than 100 ppm. The electroplated substrate is preferably annealed at a temperature between about 200° C. and about 450° C. for between about 30 seconds and 30 minutes, and more preferably, between about 250° C. and about 400° C. for between about 1 minute and 5 minutes. Rapid thermal anneal processing typically requires a temperature increase of at least 50° C. per second. To provide the required rate of temperature increase for the substrate during the anneal treatment, the heater plate is preferably maintained at between about 350° C. and about 450° C., and the substrate is preferably positioned at between about 0 mm (i.e., contacting the heater plate) and about 20 mm from the heater plate for the duration of the anneal treatment process. Preferably, a control system 222 controls the operation of the RTA chamber 211, including maintaining the desired ambient environment in the RTA chamber and the temperature of the heater plate.

After the anneal treatment process is completed, the substrate support pins 906 lift the substrate to a position for transfer out of the RTA chamber 211. The slit valve 922 opens, and the robot blade of the loading station transfer robot 228 is extended into the RTA chamber and positioned below the substrate. The substrate support pins 906 retract to lower the substrate onto the robot blade, and the robot blade then retracts out of the RTA chamber. The loading station transfer robot 228 then transfers the processed substrate into the cassette 232 for removal out of the electroplating processing system. (see FIGS. 2 and 3).

Referring back to FIG. 2, the electroplating system platform 200 includes a control system 222 that controls the functions of each component of the platform. Preferably, the control system 222 is mounted above the mainframe 214 and comprises a programmable microprocessor. The programmable microprocessor is typically programmed using a software designed specifically for controlling all components of the electroplating system platform 200. The control system 222 also provides electrical power to the components of the system and includes a control panel 223 that allows an operator to monitor and operate the electroplating system platform

200. The control panel 223, as shown in FIG. 2, is a stand-alone module that is connected to the control system 222 through a cable and provides easy access to an operator. Generally, the control system 222 coordinates the operations of the loading station 210, the RTA chamber 211, the SRD station 212, the mainframe 214 and the processing stations 218. Additionally, the control system 222 coordinates with the controller of the electrolyte replenishing system 220 to provide the electrolyte for the electroplating process.

The following is a description of a typical wafer electroplating process sequence through the electroplating system platform 200 as shown in FIG. 2. A wafer cassette containing a plurality of wafers is loaded into the wafer cassette receiving areas 224 in the loading station 210 of the electroplating system platform 200. A loading station transfer robot 228 picks up a wafer from a wafer slot in the wafer cassette and places the wafer in the wafer orientor 230. The wafer orientor 230 determines and orients the wafer to a desired orientation for processing through the system. The loading station transfer robot 228 then transfers the oriented wafer from the wafer orientor 230 and positions the wafer in one of the wafer slots in the wafer pass-through cassette 238 in the SRD station 212. The mainframe transfer robot 242 picks up the wafer from the wafer pass-through cassette 238 and positions the wafer for transfer by the flipper robot 248. The flipper robot 248 rotates its robot blade below the wafer and picks up wafer from mainframe transfer robot blade. The vacuum suction gripper on the flipper robot blade secures the wafer on the flipper robot blade, and the flipper robot flips the wafer from a face up position to a face down position. The flipper robot 248 rotates and positions the wafer face down in the wafer holder assembly 450. The wafer is positioned below the wafer holder 464 but above the cathode contact ring 466. The flipper robot 248 then releases the wafer to position the wafer into the cathode contact ring 466. The wafer holder 464 moves toward the wafer and the vacuum chuck secures the wafer on the wafer holder 464. The bladder assembly 470 on the wafer holder assembly 450 exerts pressure against the wafer backside to ensure electrical contact between the wafer plating surface and the cathode contact ring 466.

The head assembly 452 is lowered to a processing position above the process kit 420. At this position the wafer is below the upper plane of the weir 478 and contacts the electrolyte contained in the process kit 420. The power supply is activated to supply electrical power (i.e., voltage and current) to the cathode and the anode to enable the electroplating process. The electrolyte is typically continually pumped into the process kit during the electroplating process. The electrical power supplied to the cathode and the anode and the flow of the electrolyte are controlled by the control system 222 to achieve the desired electroplating results. Preferably, the head assembly is rotated as the head assembly is lowered and also during the electroplating process.

After the electroplating process is completed, the head assembly 410 raises the wafer holder assembly and removes the wafer from the electrolyte. Preferably, the head assembly is rotated for a period of time to enhance removal of residual electrolyte from the wafer holder assembly. The vacuum chuck and the bladder assembly of the wafer holder then release the wafer from the wafer holder, and the wafer holder is raised to allow the flipper robot blade to pick up the processed wafer from the cathode contact ring. The flipper robot rotates the flipper robot blade above the backside of the processed wafer in the cathode contact ring and picks up the wafer using the vacuum suction gripper on the flipper robot blade. The flipper robot rotates the flipper robot blade with the wafer out of the wafer holder assembly, flips the wafer from a face-down position to a face-up position, and positions the wafer on the mainframe transfer robot blade. The mainframe transfer robot then transfers and positions the processed wafer above the SRD module 236. The SRD wafer support lifts the wafer, and the mainframe transfer robot blade retracts away from the SRD module 236. The wafer is cleaned in the SRD module using deionized water or a combination of deionized water and a cleaning fluid as described in detail above. The wafer is then positioned for transfer out of the SRD module. The loading station transfer robot 228 picks up the wafer from the SRD module 236 and transfers the processed wafer into the RTA chamber 211 for an anneal treatment process to enhance the properties of the deposited materials. The annealed wafer is then transferred out of the RTA chamber 211 by the loading station robot 228 and placed back into the wafer cassette for removal from the electroplating system. The above-described sequence can be carried out for a plurality of wafers substantially simultaneously in the electroplating system platform 200 of the present invention. Also, the electroplating system according to the invention can be adapted to provide multi-stack wafer processing.

While the foregoing is directed to the preferred embodiment of the present invention, other and further embodiments of the invention may be devised without departing from the basic scope thereof. The scope of the invention is determined by the claims which follow.

The invention claimed is:

1. A method for processing a substrate, comprising:
    disposing the substrate on a contact ring such that the contact ring is in contact with a front side of the substrate, wherein disposing the substrate on the contact ring comprises inflating a bladder against a back side of the substrate, wherein the bladder is configured to be in contact with the back side of the substrate along a perimeter of the substrate;
    bowing the substrate towards the contact ring, wherein bowing the substrate comprises applying pressure against the back side of the substrate, wherein applying pressure comprises providing a pressure condition by a pumping system in fluid communication with a volume defined by the backside of the substrate and the bladder; and
    depositing a material on the front side of the substrate.

2. The method of claim 1, wherein the pressure condition is adjustable.

3. A method for processing a substrate, comprising:
    disposing the substrate on a contact ring such that the contact ring is in contact with a front side of the substrate, wherein disposing the substrate on the contact ring comprises inflating a bladder against a back side of the substrate, wherein the bladder is configured to be in contact with the back side of the substrate along a perimeter of the substrate;
    bowing the substrate towards the contact ring by applying a pressure to a central region of the back side of the substrate, wherein applying the pressure comprises providing a pressure condition by a pumping system in fluid communication with a volume defined by the backside of the substrate and the bladder; and
    depositing a material on the front side of the substrate.

4. The method of claim 3, wherein the pumping system for providing the pressure condition to the volume defined by the backside of the substrate is separate from a pumping system in fluid communication with and for inflating the bladder.

* * * * *